(12) United States Patent
Takada et al.

(10) Patent No.: US 8,009,713 B2
(45) Date of Patent: Aug. 30, 2011

(54) SEMICONDUCTOR LASER

(75) Inventors: Kan Takada, Kawasaki (JP); Manabu Matsuda, Kawasaki (JP); Takeshi Matsumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 160 days.

(21) Appl. No.: 12/535,463

(22) Filed: Aug. 4, 2009

(65) Prior Publication Data

US 2010/0040100 A1 Feb. 18, 2010

(30) Foreign Application Priority Data

Aug. 15, 2008 (JP) ................................ 2008-209122

(51) Int. Cl.
*H01S 5/00* (2006.01)
*H01S 3/08* (2006.01)
*H01L 21/00* (2006.01)

(52) U.S. Cl. .......... 372/50.11; 372/96; 372/102; 438/47

(58) Field of Classification Search .............. 372/50.11, 372/96, 102; 438/47
See application file for complete search history.

(56) References Cited

U.S. PATENT DOCUMENTS

| 6,477,191 B1 | 11/2002 | Okada et al. |
| 6,573,527 B1 | 6/2003 | Sugiyama et al. |
| 2008/0165818 A1 | 7/2008 | Hashimoto |

FOREIGN PATENT DOCUMENTS

| JP | 3191669 B | 10/1997 |
| JP | 2000-357841 A | 12/2000 |
| JP | 2003-691403 A | 3/2003 |
| JP | 3672678 B | 7/2005 |
| JP | 2007-299791 A | 11/2007 |

*Primary Examiner* — Armando Rodriguez
(74) *Attorney, Agent, or Firm* — Fujitsu Patent Center

(57) ABSTRACT

A semiconductor laser includes an active layer, a first GaAs layer formed on the active layer, the first GaAs layer including a plurality of recessed portions periodically arranged, each of the recessed portions including a bottom surface of a (100) crystal surface and a slope including a (111) A crystal surface at least in parts, the recessed portion being disposed in contact with each other or with a minimal gap between each of adjacent ones of the recessed portions, the width of the bottom surface being greater than the minimal gaps, an InGaP layer formed on the recessed portion, and a second GaAs layer formed on the InGaAs layer over the recessed portion.

14 Claims, 19 Drawing Sheets

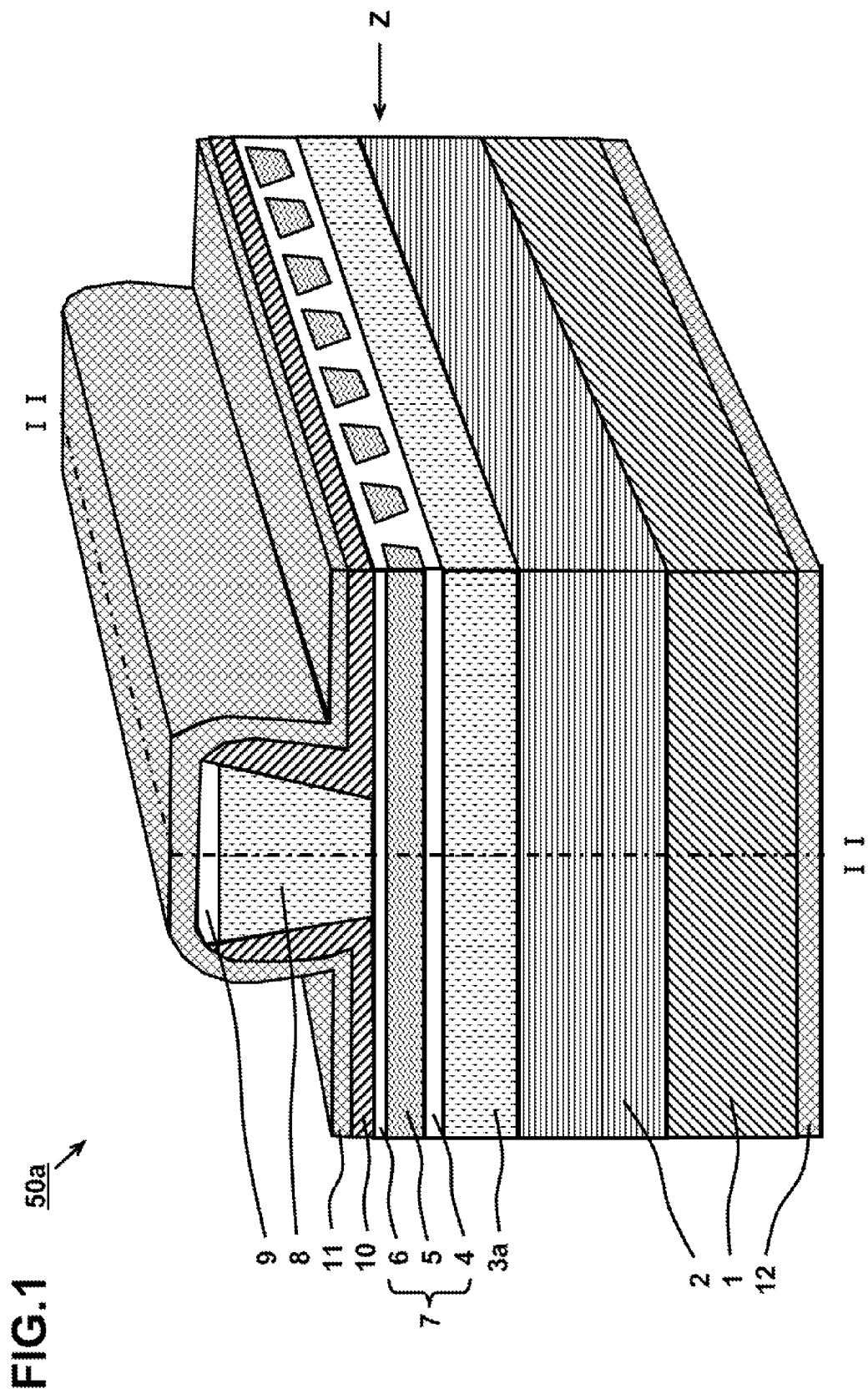

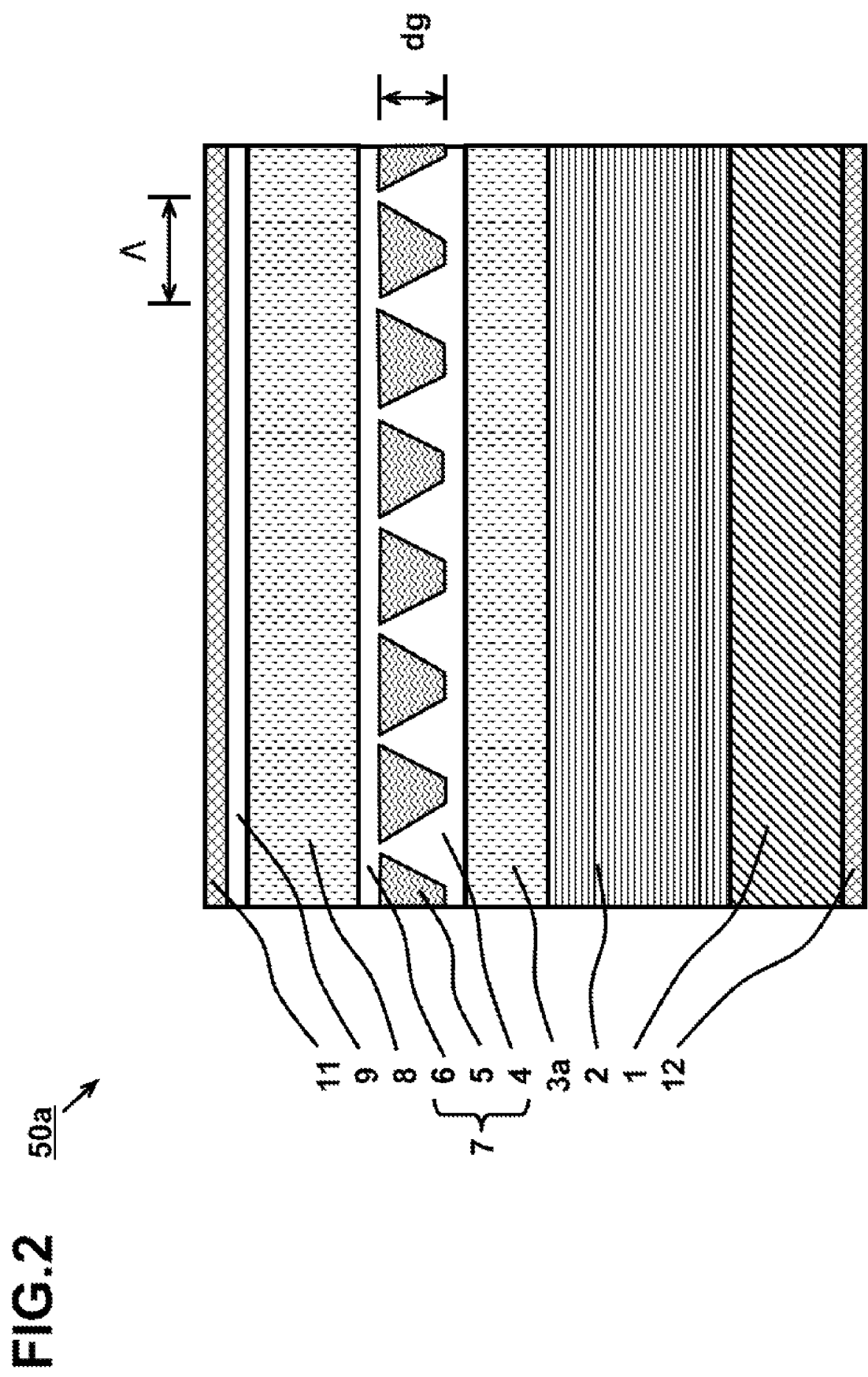

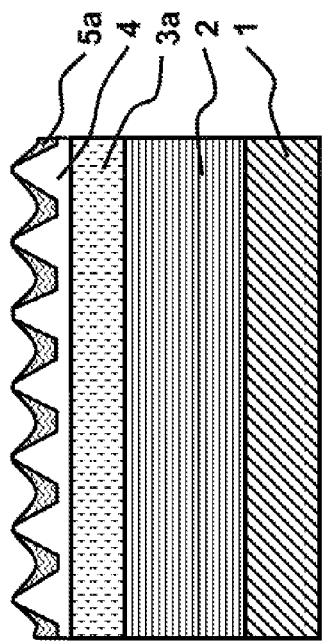
FIG.4B
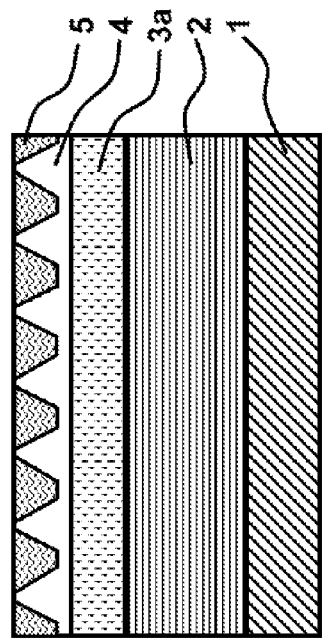
FIG.4D
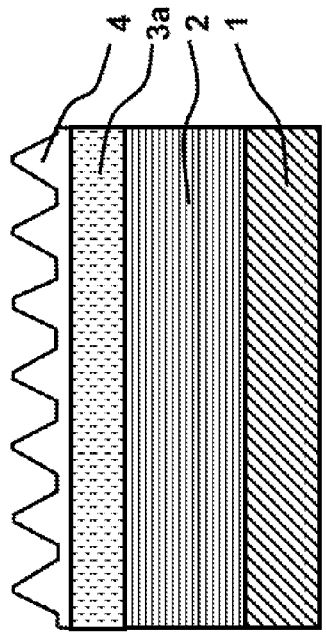
FIG.4A
FIG.4C

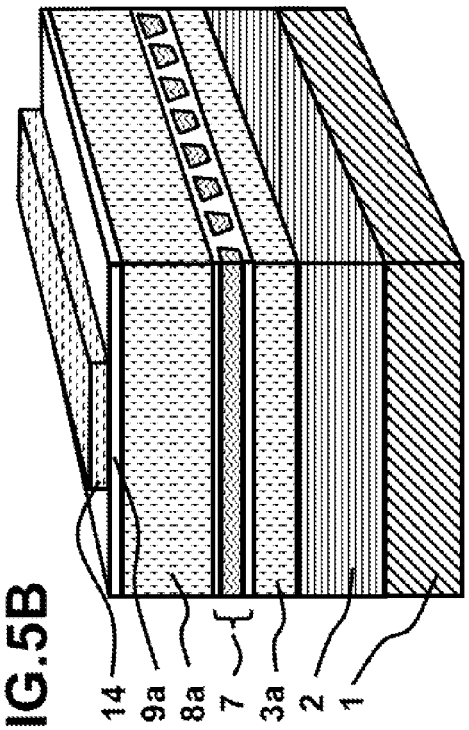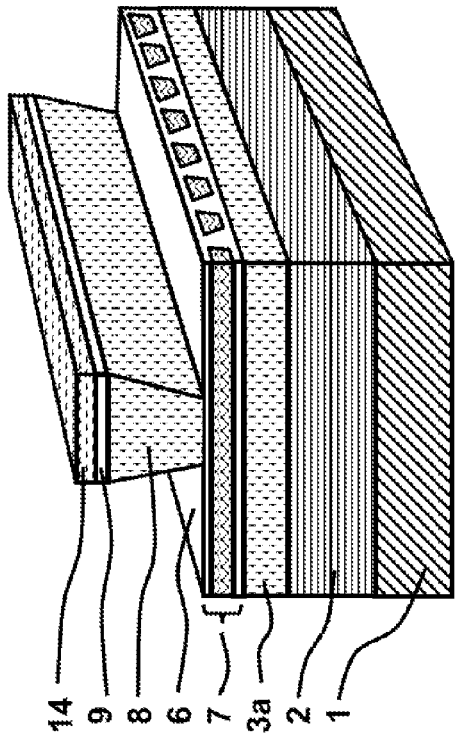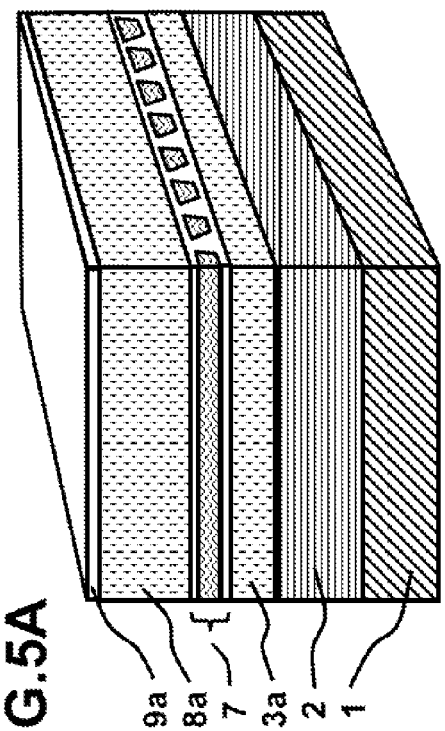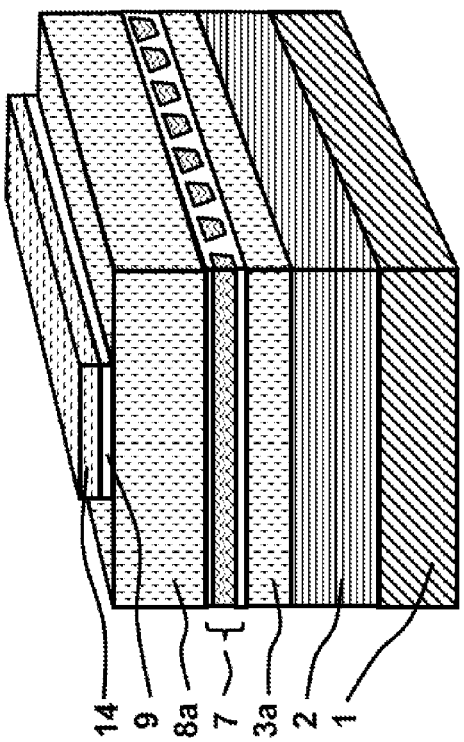

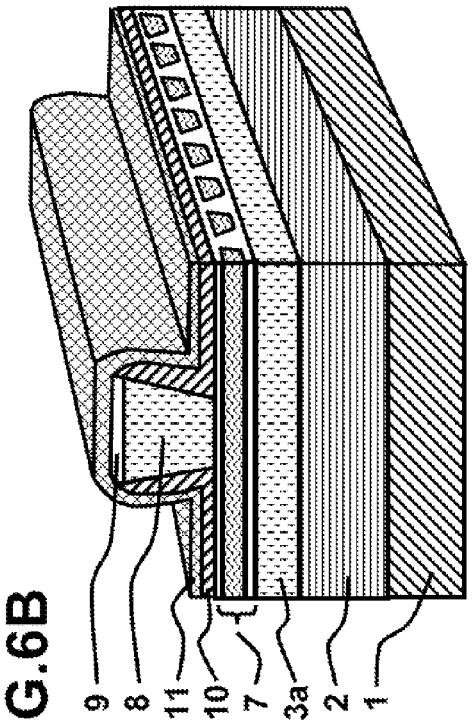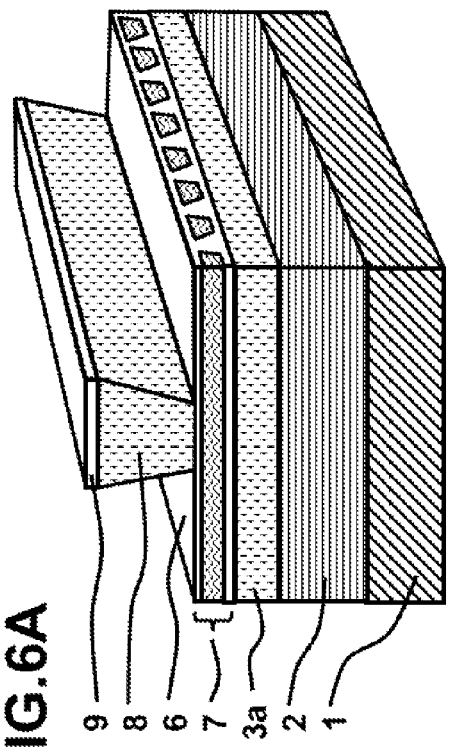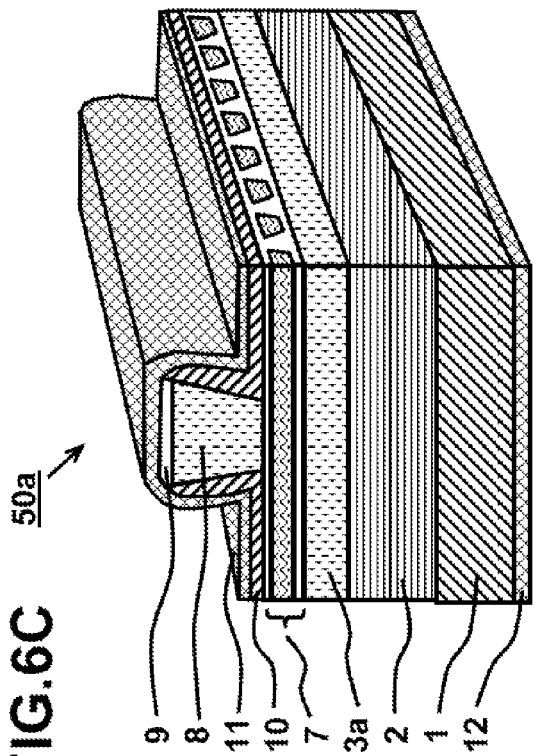

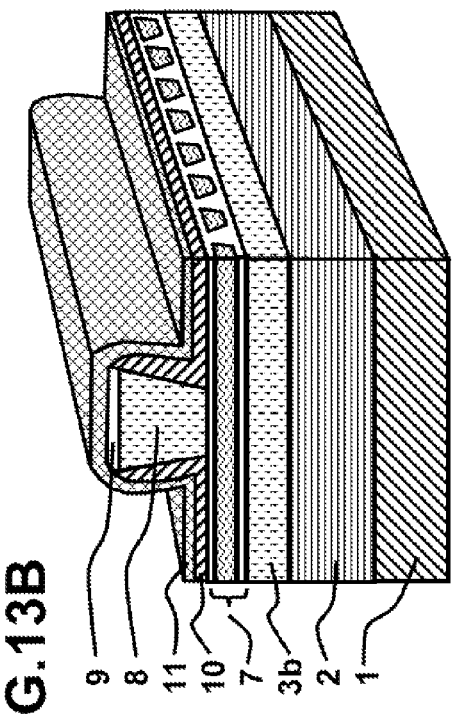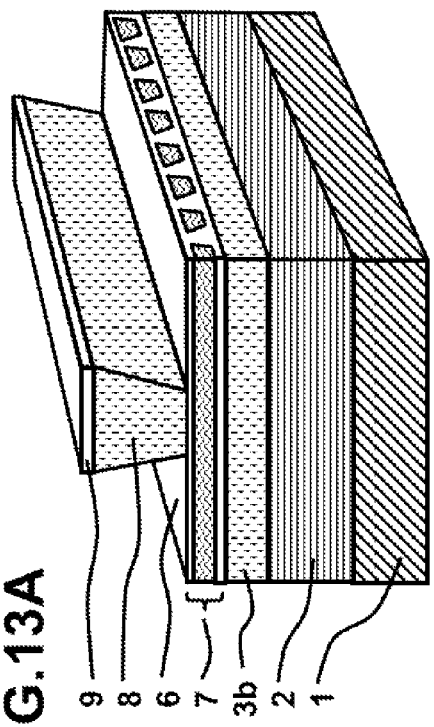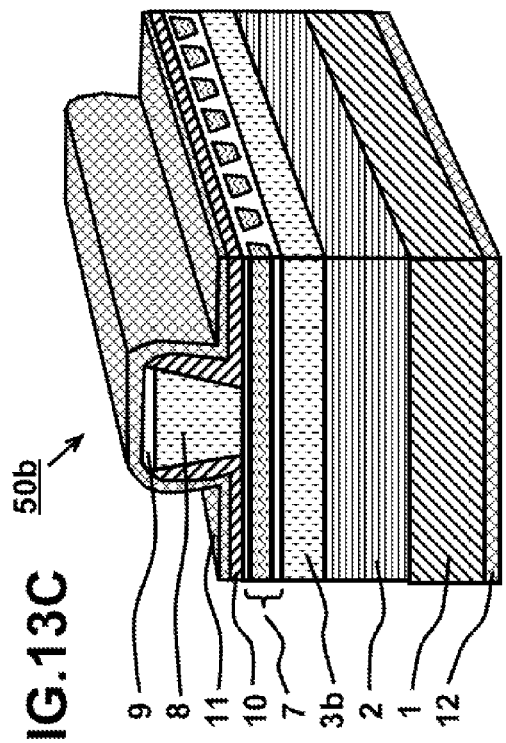

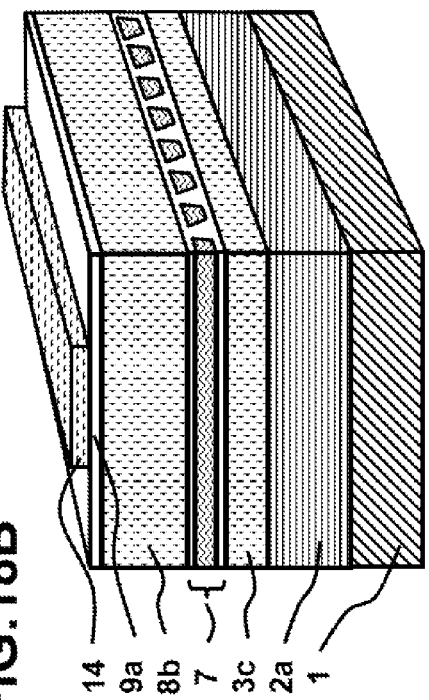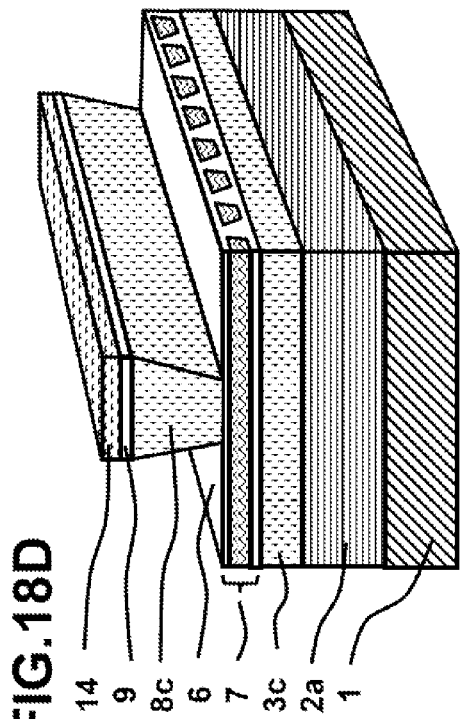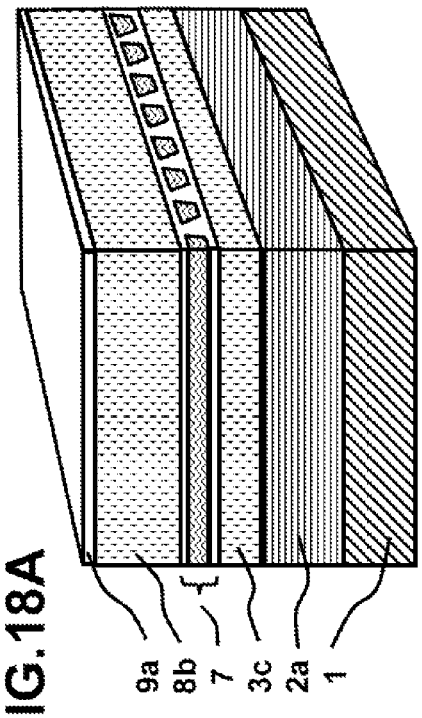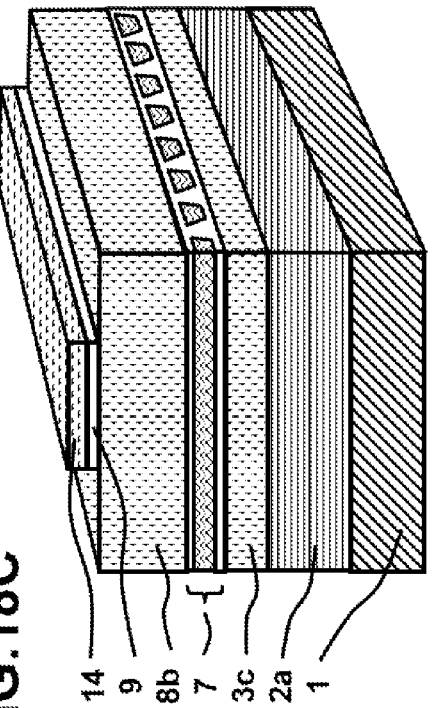

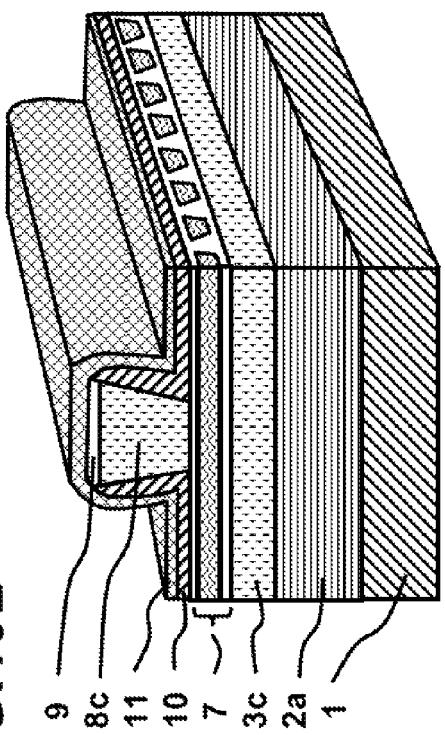
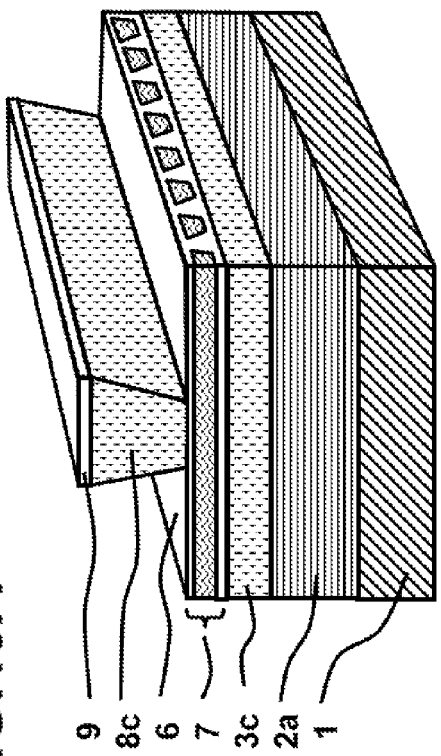
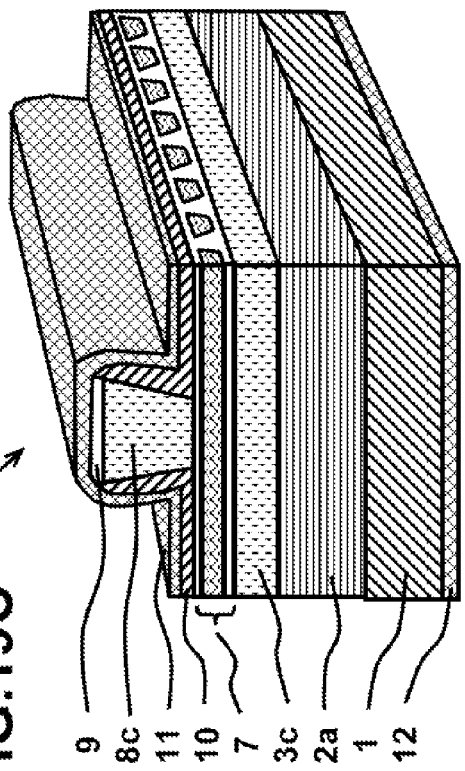

SEMICONDUCTOR LASER

CROSS-REFERENCE TO RELATED APPLICATION

This application is based upon and claims the benefit of priority of the prior Japanese Patent Application No. 2008-209122 filed on Aug. 15, 2008, the entire contents of which are incorporated herein by reference.

FIELD

An aspect of the embodiments discussed herein is directed to a semiconductor diode used as a light source for optical communication.

BACKGROUND

Known examples of semiconductor diodes for dynamic single-mode oscillation are distributed feedback (DFB) semiconductor diodes and distributed Bragg reflector (DBR) semiconductor diodes. These semiconductor diodes each include a waveguide structure containing a grating with a wavelength-selecting function. A refractive index step waveguide structure usually includes high-refractive index cladding layers and a low-refractive index waveguide layer sandwiched therebetween.

These semiconductor diodes include first cladding layers having a first conductivity type, active layers, grating layers, second cladding layers having a second conductivity type, and contact layers arranged in that order as discussed in, for example, Japanese Laid-Open Patent Publication No. 2000-357841. The grating layers each include a GaAs layer and AlGaAs layers disposed therein.

A procedure for forming a grating layer included in such a semiconductor diode is as described below. A first GaAs layer, an AlGaAs layer, and a second GaAs layer are deposited on an active layer in that order, the first GaAs layer and the AlGaAs layer being included in a lower portion of the grating layer, the second GaAs layer being included in an upper portion of the grating layer. A dielectric mask is provided on the second GaAs layer. The second GaAs layer and the AlGaAs layer are etched through the dielectric mask, whereby an irregular structure is formed. The irregular structure has recessed portions arranged in the first GaAs layer and protruding portions including portions of the AlGaAs layer and portions of the second GaAs layer. GaAs is deposited on the irregular structure such that the recessed portions of the AlGaAs layer are filled with GaAs, whereby the grating layer is formed. The upper surface of the second GaAs layer needs to be flat. This is because a flat second cladding layer is formed later.

In order to planarize the irregular structure during the formation of the grating layer, the second GaAs layer needs to be grown so as to have a large thickness. When the recessed portions are filled with GaAs, which is an As-containing material, crystals of GaAs are grown on the protruding portions; hence, the shape of the irregular structure is maintained. In order to planarize the upper surface of the grating layer, GaAs needs to be further deposited on the irregular structure after the filling of the recessed portions with GaAs until irregularities due to the irregular structure disappear. Therefore, the second GaAs layer has an increased thickness.

When the second GaAs layer has an increased thickness, the field of light guided in the active layer is attracted toward the second GaAs layer because the grating layer overlies the active layer and the second GaAs layer has a large refractive index. This reduces the effect of confining light in the active layer. A reduction in the effect of confining light in the active layer causes a reduction in effective gain and an increase in oscillation threshold current. This may deteriorate the oscillation properties.

In order to prevent the reduction of the effect of confining light in the active layer, the thickness of a re-grown layer made of GaAs, that is, it may be desirable to prevent the thickness of the second GaAs layer from increasing and it may be desirable to flatten the upper surface of the grating layer.

SUMMARY

According to an aspect of an embodiment, a semiconductor laser includes an active layer, a first GaAs layer formed on the active layer, the first GaAs layer including a plurality of recessed portions periodically arranged, each of the recessed portions including a bottom surface of a (100) crystal surface and a slope including a (111)A crystal surface at least in parts, the recessed portion being disposed in contact with each other or with a minimal gap between each of adjacent ones of the recessed portions, the width of the bottom surface being greater than the minimal gaps, an InGaP layer formed on the recessed portion, and a second GaAs layer formed on the InGaP layer over the recessed portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 is a perspective view of a semiconductor diode 50a according to a first embodiment;

FIG. 2 is a sectional view of the semiconductor diode 50a according to the first embodiment;

FIGS. 4A-4D are illustrations illustrating operations of the method of manufacturing the semiconductor diode 50a according to the first embodiment;

FIGS. 5A-5D are illustrations illustrating operations of the method of manufacturing the semiconductor diode 50a according to the first embodiment;

FIGS. 6A-6C are illustrations illustrating operations of the method of manufacturing the semiconductor diode 50a according to the first embodiment;

FIGS. 13A-13C are illustrations illustrating operations of the method of manufacturing the semiconductor diode 50b according to the second embodiment;

FIGS. 18A-18D are illustrations illustrating operations of the method of manufacturing the semiconductor diode 50c according to the third embodiment; and FIGS. 19A-19C are illustrations illustrating operations of the method of manufacturing the semiconductor diode 50c according to the third embodiment.

DESCRIPTION OF EMBODIMENTS

Figure 3A:
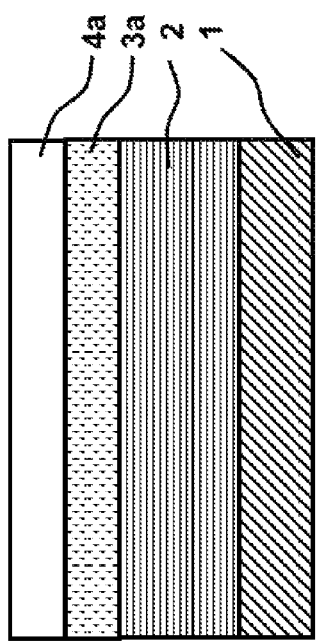
FIGS. 3A-3D are illustrations illustrating operations of a method of manufacturing the semiconductor diode 50a according to the first embodiment.

Embodiments of the present invention will now be described. The present invention is not limited to the embodiments.

FIG. 1 is a perspective view of a semiconductor diode 50a according to a first embodiment. FIG. 2 is a sectional view of the semiconductor diode 50a taken along the line II-II of FIG. 1, the semiconductor diode 50a being viewed in the z-direction.

With reference to FIG. 1, reference numeral 1 represents a p-type GaAs substrate, reference numeral 2 represents a first cladding layer, reference numeral 3a represents an active layer, reference numeral 4 represents a GaAs layer, reference numeral 5 represents InGaP layers, reference numeral 6 represents a GaAs cap layer, reference numeral 7 represents a grating layer, reference numeral 8 represents a second cladding layer, reference numeral 9 represents a contact layer, reference numeral 10 represents SiO$_2$ protective layers, reference numeral 11 represents an upper electrode, and reference numeral 12 represents a lower electrode.

The first cladding layer 2 overlies the p-type GaAs substrate 1 as illustrated in FIG. 1. The p-type GaAs substrate 1 has a thickness of, for example, 100 μm to 150 μm. A p-type GaAs buffer layer, which is not illustrated, lies on the p-type GaAs substrate 1. The p-type GaAs buffer layer has a thickness of, for example, 400 nm to 500 nm. A surface of the p-type GaAs substrate 1 that underlies the first cladding layer 2 preferably has a (100) crystal surface.

The first cladding layer 2 contains, for example, p-type AlGaAs and has a thickness of, for example, 1.0 μm to 1.5 μm. The p-type GaAs buffer layer acts as a buffer for growing the first cladding layer 2 composed of p-type AlGaAs with good crystalinity.

The active layer 3a overlies the first cladding layer 2. The active layer 3a may have a bulk structure, a single-quantum well (SQW) structure, or a multi-quantum well (MQW) structure. When the active layer 3a has such a MQW structure, the active layer 3a includes barrier layers and well layers alternately arranged.

The active layer 3a preferably contains, for example, Ga, As, and N. Examples of a material for forming the active layer 3a include GaInNAs and GaNAs.

The bandgap energy and refractive index of the active layer 3a can be controlled by adjusting the ratio of components in the active layer 3a. The active layer 3a preferably includes, for example, GaAs barrier layers and Ga$_{0.65}$In$_{0.35}$N$_{0.006}$As$_{0.994}$ well layers alternately arranged.

The grating layer 7 extends over the entire length of the active layer 3a in parallel to the active layer 3a. The grating layer 7 has a region including portions of the GaAs layer 4 and the InGaP layers 5. The GaAs layer portions are different in refractive index from the InGaP layers 5. The GaAs layer portions and the InGaP layers 5 are periodically arranged along the active layer 3a. The pitch of the GaAs layer portions is the same as that of the InGaP layers 5. The grating layer 7 reflects only specific components of light leaking from the active layer 3a, the specific light components having wavelengths close to the Bragg wavelength $\lambda_{Bragg}$ determined from the period of the grating layer 7 and the equivalent refractive index of a waveguide. This allows only the specific light components, which have wavelengths within a range close to the Bragg wavelength $\lambda_{Bragg}$, to resonate, thereby ensuring single-mode oscillation. The grating layer 7 includes the GaAs layer 4, the InGaP layers 5, and the GaAs cap layer 6. The GaAs layer 4, the InGaP layers 5, and the GaAs cap layer 6 are preferably undoped. The structure of the grating layer 7 is described below in detail with reference to FIG. 2.

The second cladding layer 8 overlies the grating layer 7. The second cladding layer 8 preferably contains n-type InGaP and preferably has a thickness of, for example, 1.0 μm to 1.5 μm. In order to increase the effect of confining light, the second cladding layer 8 preferably has a ridge shape.

The contact layer 9 overlies the second cladding layer 8. Since the contact layer 9 is in ohmic contact with the upper electrode 11, the contact layer 9 is preferably made of a Group III-V compound semiconductor having a bandgap less than that of the second cladding layer 8. In particular, the contact layer 9 is preferably made of, for example, n-type GaAs. The contact layer 9 preferably has a thickness of, for example, 200 nm to 300 nm.

The SiO$_2$ protective layers 10 each extend over a side surface of the second cladding layer 8 and the GaAs cap layer 6. The SiO$_2$ protective layers 10 preferably have a thickness of, for example, 300 nm to 400 nm.

The upper electrode 11 extends over the contact layer 9 and the SiO$_2$ protective layers 10. The upper electrode 11 is preferably made of, for example, AuGe/Au and preferably has a thickness of, for example, 200 nm to 300 nm.

The lower electrode 12 underlies a surface of the p-type GaAs substrate 1 that is opposite to a surface of the p-type GaAs substrate 1 that is located under the first cladding layer 2. The lower electrode 12 is preferably made of, for example, AuGe/Au and preferably has a thickness of, for example, 200 nm to 300 nm.

The structure of the grating layer 7 is described below with reference to FIG. 2.

With reference to FIG. 2, the grating layer 7 includes the GaAs layer 4, the InGaP layers 5, and the GaAs cap layer 6 as described above. The GaAs layer 4 has a surface which is parallel to the (100) plane and which is in contact with the upper surface of the active layer 3a. The GaAs layer 4 has recessed portions which are arranged at a pitch A of, for example, 190 nm to 200 nm and which each have two slopes parallel to the (111) A plane. In this embodiment, the (111) A plane and the (−1−1−1) A plane, which each parallel to a corresponding one of the two slopes, are collectively referred to as the (111) A plane.

The depth dg of the recessed portions is preferably, for example, 20 nm to 60 nm. The pitch and depth of the recessed portions are set such that the emission wavelength of the semiconductor diode 50a is about 1.3 μm. The depth of the recessed portions is set such that the coupling coefficient κ of the grating layer 7 is about 50 cm$^{-1}$ to 100 cm$^{-1}$.

The InGaP layers 5 are disposed in the recessed portions. The InGaP layers 5 preferably have a thickness of, for example, less than 50 nm and may be arranged over the upper surface of the GaAs layer 4.

The GaAs cap layer 6 extends over the GaAs layer 4 and the InGaP layers 5. The GaAs cap layer 6 preferably has a thickness of, for example, 5 nm to 20 nm.

Light travels in the semiconductor diode 50a with a distribution centered at the active layer 3a and is repeatedly reflected by the interfaces between the GaAs layer 4 and the InGaP layers 5 because of the difference in refractive index between the GaAs layer 4 and the InGaP layers 5. A forward wave and backward wave that are in phase at a wavelength resonate with each other, thereby ensuring the single-mode oscillation of the semiconductor diode 50a.

A method of manufacturing the semiconductor diode 50a will now be described with reference to FIGS. 3 to 5.

FIG. 3A is an illustration illustrating that the first cladding layer 2 and the active layer 3a are formed above the p-type GaAs substrate 1 in that order. As illustrated in FIG. 3A, the p-type GaAs buffer layer, which is not illustrated, is deposited on the p-type GaAs substrate 1. The p-type GaAs buffer layer is preferably formed by, for example, molecular beam epitaxy (MBE) or metal-organic vapor phase epitaxy (MOVPE).

The first cladding layer 2 is formed on the p-type GaAs buffer layer of the p-type GaAs substrate 1 so as to have a thickness of, for example, 1.0 μm to 1.5 μm. For example, p-type AlGaInAs is preferably used to form the first cladding layer 2. The first cladding layer 2 is preferably formed by, for example, MBE or MOVPE.

The active layer 3a is formed on the first cladding layer 2 in such a manner that the GaAs barrier layers and the $Ga_{0.65}In_{0.35}N_{0.006}As_{0.994}$ well layers are alternately deposited on the first cladding layer 2. The active layer 3a is preferably formed by, for example, MBE or MOVPE.

Figure 3B:
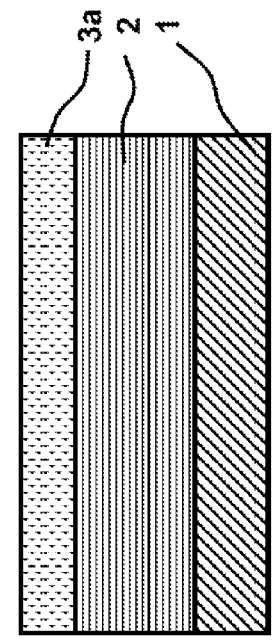

FIG. 3B is an illustration illustrating that a GaAs layer 4a is formed on the active layer 3a. As illustrated in FIG. 3B, the GaAs layer 4a is formed on the active layer 3a so as to have a thickness of, for example, 20 nm to 60 nm. The upper surface of the GaAs layer 4a is preferably parallel to the (100) plane. The GaAs layer 4a is preferably undoped. The GaAs layer 4a is preferably formed by, for example, MBE or MOVPE subsequently to the growth of the active layer 3a.

Figure 3C:
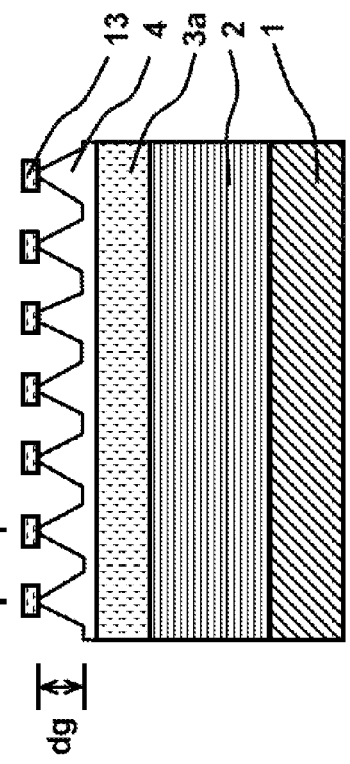

FIG. 3C is an illustration illustrating that $SiO_2$ mask layers 13 are formed on the GaAs layer 4a. As illustrated in FIG. 3C, a $SiO_2$ layer, which is not illustrated, is formed on the GaAs layer 4a so as to have a thickness of, for example, 20 nm to 100 nm. A resist layer, which is not illustrated, is formed on the $SiO_2$ layer. The resist layer is subjected to exposure by electron beam (EB) exposure or interference exposure in such a manner that a grating pattern is projected onto the resist layer at a pitch of, for example, 190 nm to 200 nm and a duty of, for example, 10% to 50%. The resist layer reformed by exposure is partly stripped with a developing solution, which is not illustrated, whereby the grating pattern is transferred to the resist layer. The $SiO_2$ layer is etched through the resulting resist layer by reactive ion etching (RIE) using, for example, $CF_4$ plasma, whereby the $SiO_2$ mask layers 13 are formed. The $SiO_2$ mask layers 13 are arranged at a pitch of, for example, 200 nm and have a width of, for example, 100 nm.

Figure 3D:
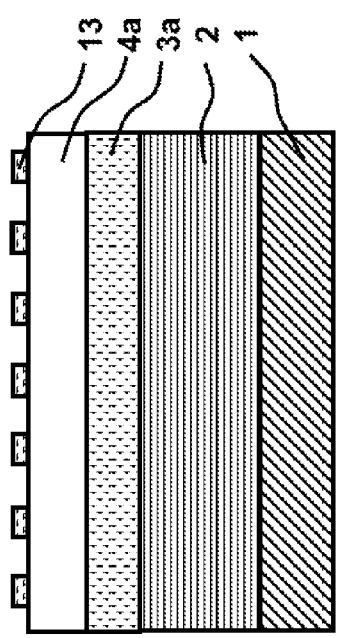

FIG. 3D is an illustration illustrating that the GaAs layer 4a is etched using the $SiO_2$ mask layers 13 as a mask. As illustrated in FIG. 3D, the GaAs layer 4a is anisotropically etched with a solution prepared by mixing, for example, aqueous ammonia, aqueous hydrogen peroxide, and water.

The mixing ratio of aqueous ammonia to aqueous hydrogen peroxide to water is preferably, for example, three to one to 50.

The etching rate of the (100) plane of the GaAs layer 4a is greater than that of the (111) A plane thereof. Therefore, the (100) plane of the GaAs layer 4a is substantially selectively etched. The etching rate thereof is, for example, 2 nm/s at an etching temperature of 25° C. The etching of the GaAs layer 4a allows the GaAs layer 4, which has the recessed portions which has a depth dg of 20 nm to 60 nm and which are arranged at a pitch Λ of 190 nm to 200 nm, to be formed. The bottom surface of each recessed portion is parallel to the (100) plane and the slopes of the recessed portion are parallel to the (111) A plane. The distance between the upper ends of the adjacent recessed portions is less than the width of the bottom surface of each recessed portion.

In this embodiment, the mask used to form the recessed portions is made of $SiO_2$. A material for forming the mask is not limited to $SiO_2$ and may be SiN.

A mask for electron beam exposure or interference exposure may be used to etch the GaAs layer 4a instead of that mask. An etchant for etching the GaAs layer 4a is not limited to the solution prepared by mixing aqueous ammonia, aqueous hydrogen peroxide, and water and may be any solution capable of etching the GaAs layer 4a.

FIG. 4A is an illustration illustrating that the $SiO_2$ mask layers 13 is removed from the GaAs layer 4a. The $SiO_2$ mask layers 13 are preferably removed with buffered hydrofluoric acid as illustrated in FIG. 4A.

FIG. 4B is an illustration illustrating that InGaP layers 5a are deposited on the GaAs layer 4. The InGaP layers 5a are formed on the GaAs layer 4 by, for example, MOVPE as illustrated in FIG. 4B. The InGaP layers 5a are preferably formed at about 600° C. in, for example, an $AsH_3$ atmosphere. Group-III element-containing gases for forming the InGaP layers 5a are gaseous trimethyl indium (TMIn) and trimethyl Gallium (TMGa) and a Group-V element-containing gas for forming the InGaP layers 5a is gaseous phosphine ($PH_3$). The InGaP layers 5a are preferably undoped.

The GaAs layer 4 has protruding portions of which the tops have a small area; hence, the InGaP layers 5a are prevented from being formed on the tops of the protruding portions when the InGaP layers 5a are formed on the GaAs layer 4. That is, since the distance between the upper ends of the adjacent recessed portions is less than that of the bottom thereof, the InGaP layers 5a are prevented from being formed on the tops of the protruding portions but are selectively formed in the recessed portions.

FIG. 4C is an illustration illustrating that the InGaP layers 5a are grown to be the InGaP layers 5, which extend from the bottom surfaces of the recessed portions to the tops thereof. The recessed portions of the GaAs layer 4 are disposed in contact with each other or with a minimal gap between each of adjacent ones of the recessed portions, the width of the bottom surface being greater than the minimal gaps. The recessed portions are filled with the InGaP layers 5 as illustrated in FIG. 4C. The tops of the protruding portions of the GaAs layer 4 and the upper surfaces of the InGaP layers 5 are substantially flush with each other.

FIG. 4D is an illustration illustrating that the GaAs cap layer 6 is formed over the tops of the protruding portions of the GaAs layer 4 and the InGaP layers 5. The GaAs cap layer 6 is preferably formed by MOVPE as illustrated in FIG. 4D. Since the recessed portions are filled with the InGaP layers 5, the GaAs cap layer 6, which is thin, can be formed so as to have a flat surface. The grating layer 7, in which the recessed portions are filled with the InGaP layers 5, is formed as described above.

FIG. 5A is an illustration illustrating that an n-type InGaP layer 8a and an n-type GaAs layer 9a are deposited on the grating layer 7 in that order. As illustrated in FIG. 5A, the n-type InGaP layer 8a is formed on the grating layer 7 by, for example, MOVPE. The n-type InGaP layer 8a preferably has a thickness of, for example, 1.0 μm to 1.5 μm. The n-type GaAs layer 9a is formed on the n-type InGaP layer 8a by, for example, MOVPE. The n-type GaAs layer 9a preferably has a thickness of, for example, 200 nm to 300 nm.

FIG. 5B is an illustration illustrating that a SiO$_2$ mask layer 14 is formed on the n-type GaAs layer 9a. As illustrated in FIG. 5B, the SiO$_2$ mask layer 14 is formed on the n-type GaAs layer 9a so as to extend over the entire length of the active layer 3a in parallel to the active layer 3a. The SiO$_2$ mask layer 14 preferably has a width of, for example, 2.5 μm to 4.0 μm and a thickness of, for example, 300 nm to 400 nm.

FIG. 5C is an illustration illustrating that the n-type GaAs layer 9a, which lies on the n-type InGaP layer 8a, is etched using the SiO$_2$ mask layer 14 as a mask. As illustrated in FIG. 5C, the n-type GaAs layer 9a is etched with a solution prepared by mixing, for example, aqueous ammonia, aqueous hydrogen peroxide, and water. The mixing ratio of aqueous ammonia to aqueous hydrogen peroxide to water is, for example, three to one to 50. The etching of the n-type GaAs layer 9a results in the formation of the contact layer 9. The contact layer 9 contains n-type GaAs, lies on the n-type InGaP layer 8a, extends over the entire length of the active layer 3a, and has a width of, for example, 2.0 μm to 3.5 μm.

FIG. 5D is an illustration illustrating that the n-type InGaP layer 8a, which lies on the GaAs cap layer 6, is etched using the SiO$_2$ mask layer 14 as a mask. As illustrated in FIG. 5D, the n-type InGaP layer 8a is etched with a solution prepared by mixing, for example, hydrochloric acid (HCl) and acetic acid (CH$_3$COOH). The ratio of hydrochloric acid to acetic acid in this solution is preferably, for example, one to two. In this etching operation, the second cladding layer 8 is formed. The second cladding layer 8 has a ridge structure, lies on the GaAs cap layer 6, extends over the entire length of the active layer 3a, and has a width of, for example, 1.5 μm to 2.0 μm.

The GaAs cap layer 6 acts as an etching stopper for the n-type InGaP layer 8a. This is because the GaAs cap layer 6 may not be etched hydrochloric acid or acetic acid. Therefore, the ridge structure of the second cladding layer 8 can be formed with high accuracy.

FIG. 6A is an illustration illustrating that the SiO$_2$ mask layer 14 is removed from the contact layer 9. As illustrated in FIG. 6A, the SiO$_2$ mask layer 14 is preferably removed with buffered hydrofluoric acid.

FIG. 6B is an illustration illustrating that the SiO$_2$ protective layers 10 are each formed over a side surface of the second cladding layer 8 and the grating layer 7 and the upper electrode 11 is formed over the SiO$_2$ protective layers 10 and the upper electrode 11.

A SiO$_2$ layer, which is not illustrated, is formed over the contact layer 9, side surfaces of the second cladding layer 8, and the grating layer 7 as illustrated in FIG. 6B. The SiO$_2$ layer is preferably formed by, for example, a chemical vapor deposition (CVD) process. The SiO$_2$ layer preferably has a thickness of 300 nm to 400 nm. Resist layers, which are not illustrated, are formed above the side surfaces of the second cladding layer 8 and the grating layer 7. A portion of the SiO$_2$ layer that lies on the contact layer 9 is selectively removed, whereby the SiO$_2$ protective layers 10 are formed over the side surfaces of the second cladding layer 8 and the grating layer 7.

The upper electrode 11 is formed over the SiO$_2$ protective layers 10 and the contact layer 9. The upper electrode 11 is preferably formed by, for example, a vapor deposition process or a sputtering process.

FIG. 6C is an illustration illustrating that the lower electrode 12 is formed on a surface of the p-type GaAs substrate 1 that is opposite to a surface of the p-type GaAs substrate 1 that is located under the first cladding layer 2. The lower electrode 12 is preferably formed by, for example, a vapor deposition process or a sputtering process. Before the lower electrode 12 is formed on the p-type GaAs substrate 1, the p-type GaAs substrate 1 is polished so as to have a thickness of 100 μm to 150 μm.

When the grating layer 7 has a phase shift-free uniform grating structure, an anti-reflective coating and highly reflective coating, which are not illustrated, are formed on the front end surface and rear end surface, respectively, of a laminate including the above layers subsequently to the above operation. When the grating layer 7 has a λ/4 phase shift, anti-reflective coatings, which are not illustrated, are formed on the front and rear end surfaces of the laminate. The semiconductor diode 50a is completed through these operations.

According to the method of manufacturing the semiconductor diode 50a of the first embodiment, the InGaP layers 5a are prevented from being formed on the tops of the protruding portions but are primarily formed in the recessed portions when the InGaP layers 5a are formed on the GaAs layer 4, because the tops of the protruding portions have a small area, that is, the distance between the upper ends of the adjacent recessed portions is less than that of the bottom thereof. The recessed portion is disposed in contact with each other or with a minimal gap between each of adjacent ones of the recessed portions, the width of the bottom surface being greater than the minimal gaps. After the recessed portions are filled with the InGaP layers 5, the tops of the protruding portions and the upper surfaces of the InGaP layers 5 are substantially flush with each other; hence, the GaAs cap layer 6, which is thin, can be formed so as to have a flat surface. Since the GaAs cap layer 6, which is located in an upper portion of the grating layer 7, is thin, the field of light is prevented from being attracted toward the GaAs cap layer 6 and therefore the light field can be effectively confined in a region including the active layer 3a. Therefore, the semiconductor diode 50a has good oscillation properties.

A semiconductor diode 50b according to a second embodiment and a method of manufacturing the semiconductor diode 50b will now be described in detail with reference to FIGS. 7 to 13. In this embodiment, the same components as those described in the first embodiment are represented by the same reference numerals as those used in the first embodiment and will not be described in detail.

The semiconductor diode 50b includes an active layer having a quantum dot structure and therefore has lower power consumption and less temperature dependence as compared to the semiconductor diode 50a of the first embodiment.

Figure 7:
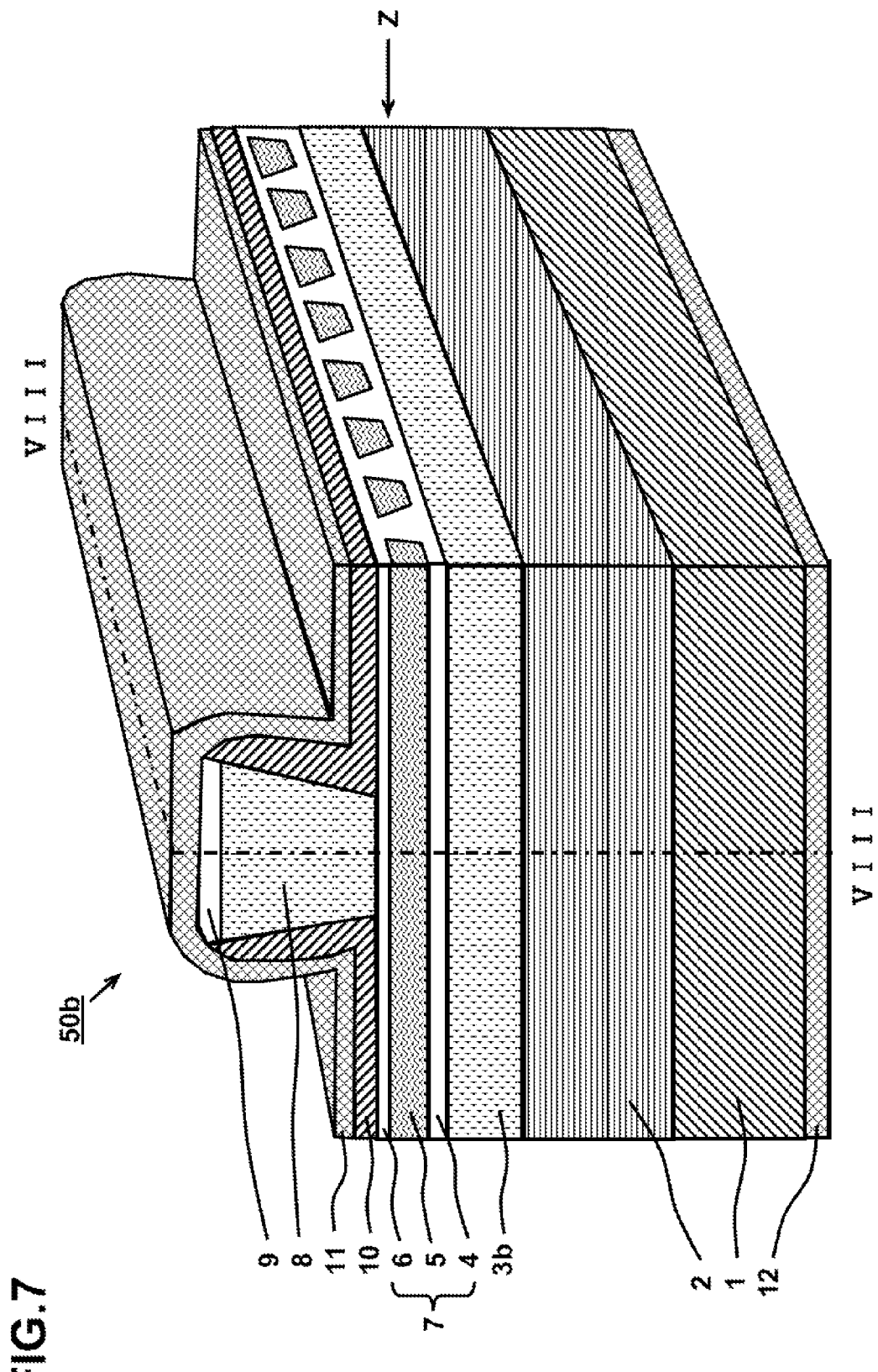
FIG. 7 is a perspective view of a semiconductor diode 50b according to a second embodiment.
Figure 8:
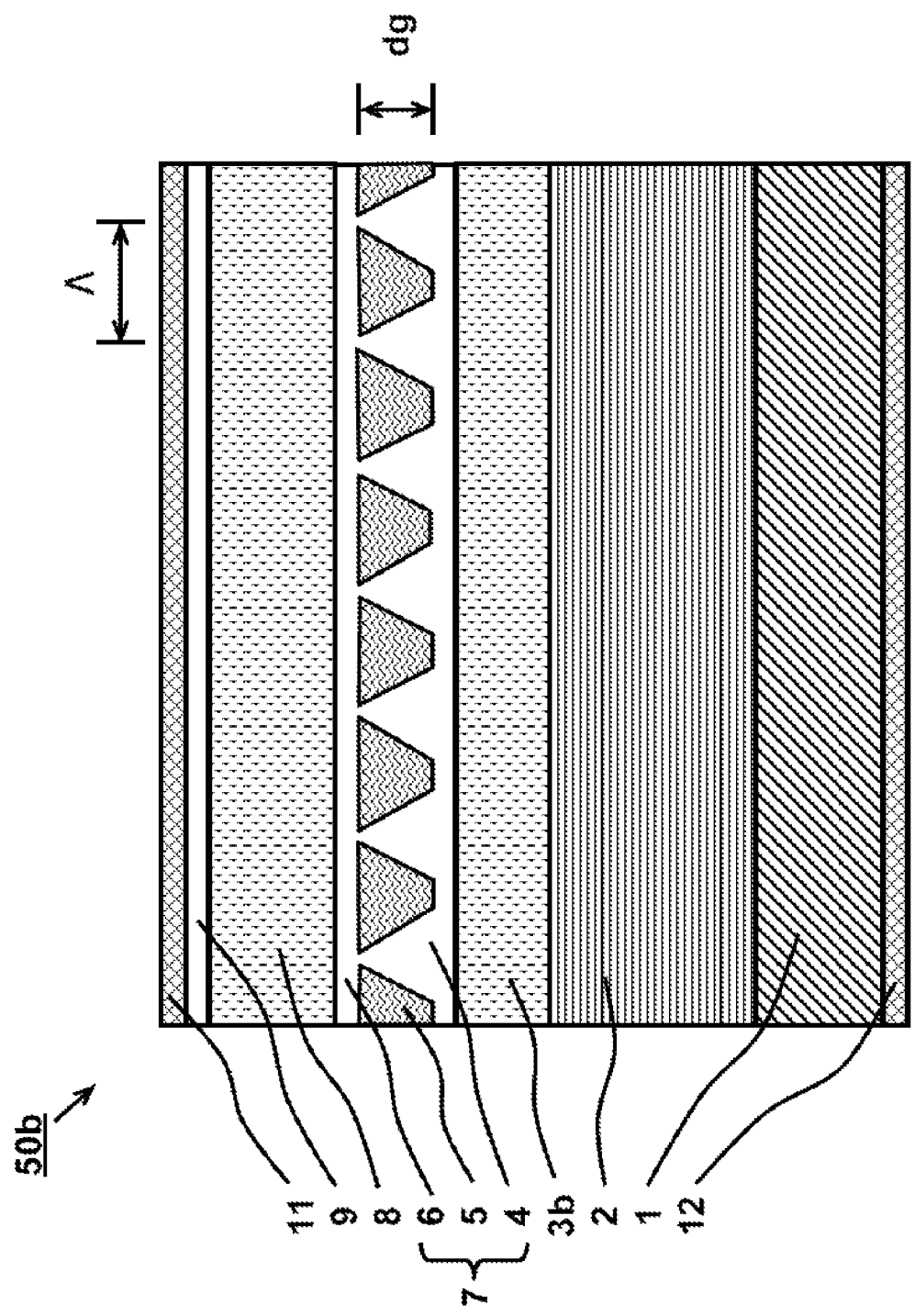
FIG. 8 is a sectional view of the semiconductor diode 50b according to the second embodiment.

FIG. 7 is a perspective view of the semiconductor diode 50b. FIG. 8 is a sectional view of the semiconductor diode 50b taken along the line VIII-VIII of FIG. 7, the semiconductor diode 50b being viewed in the z-direction.

With reference to FIG. 7, reference numeral 1 represents a p-type GaAs substrate, reference numeral 2 represents a first cladding layer, reference numeral 3b represents an active layer, reference numeral 4 represents a GaAs layer, reference numeral 5 represents InGaP layers, reference numeral 6 represents a GaAs cap layer, reference numeral 7 represents a grating layer, reference numeral 8 represents a second cladding layer, reference numeral 9 represents a contact layer, reference numeral 10 represents $SiO_2$ protective layers, reference numeral 11 represents an upper electrode, and reference numeral 12 represents a lower electrode.

The first cladding layer 2 overlies the p-type GaAs substrate 1 as illustrated in FIG. 7. The p-type GaAs substrate 1 has a thickness of, for example, 100 µm to 150 µm. A p-type GaAs buffer layer, which is not illustrated, lies on the p-type GaAs substrate 1. The p-type GaAs buffer layer has a thickness of, for example, 500 nm.

The first cladding layer 2 contains, for example, p-type AlGaAs and has a thickness of, for example, 1.0 µm to 1.5 µm.

The first cladding layer 2 underlies the active layer 3b. The active layer 3b has a quantum dot structure. The structure of the active layer 3b is described below in detail with reference to FIG. 9.

The grating layer 7 extends over the entire length of the active layer 3b in parallel to the active layer 3b. The grating layer 7 has a region including portions of the GaAs layer 4 and the InGaP layers 5. The GaAs layer portions are different in refractive index from the InGaP layers 5. The GaAs layer portions and the InGaP layers 5 are periodically arranged along the active layer 3b. The pitch of the GaAs layer portions is the same as that of the InGaP layers 5. The grating layer 7 includes the GaAs layer 4, the InGaP layers 5, and the GaAs cap layer 6. The GaAs layer 4, the InGaP layers 5, and the GaAs cap layer 6 are preferably undoped. The structure of the grating layer 7 is described below in detail with reference to FIG. 8.

The second cladding layer 8 overlies the grating layer 7. The second cladding layer 8 preferably contains n-type InGaP and has a thickness of, for example, 1.0 µm to 1.5 µm. In order to increase the effect of confining light and the effect of confining a current, the second cladding layer 8 preferably has a ridge shape.

The structure of the grating layer 7 is described below with reference to FIG. 8.

With reference to FIG. 8, the grating layer 7 as well as that illustrated in FIG. 2 includes the GaAs layer 4, the InGaP layers 5, and the GaAs cap layer 6 as described above. The GaAs layer 4 has recessed portions which are arranged at a pitch Λ of, for example, 190 nm to 200 nm and which have slopes parallel to the (111) A plane. The depth dg of the recessed portions is preferably, for example, 20 nm to 60 nm. The pitch of the recessed portions is set such that the emission wavelength of the semiconductor diode 50b is about 1.3 µm. The depth of the recessed portions is set such that the coupling coefficient κ of the grating layer 7 is about 50 $cm^{-1}$ to 100 $cm^{-1}$.

The InGaP layers 5 as well as those illustrated in FIG. 2 are disposed in the recessed portions. The InGaP layers 5 preferably have a thickness of, for example, less than 50 nm and may be arranged over the upper surface of the GaAs layer 4.

The GaAs cap layer 6 as well as that illustrated in FIG. 2 extends over the GaAs layer 4 and the InGaP layers 5.

Figure 9:
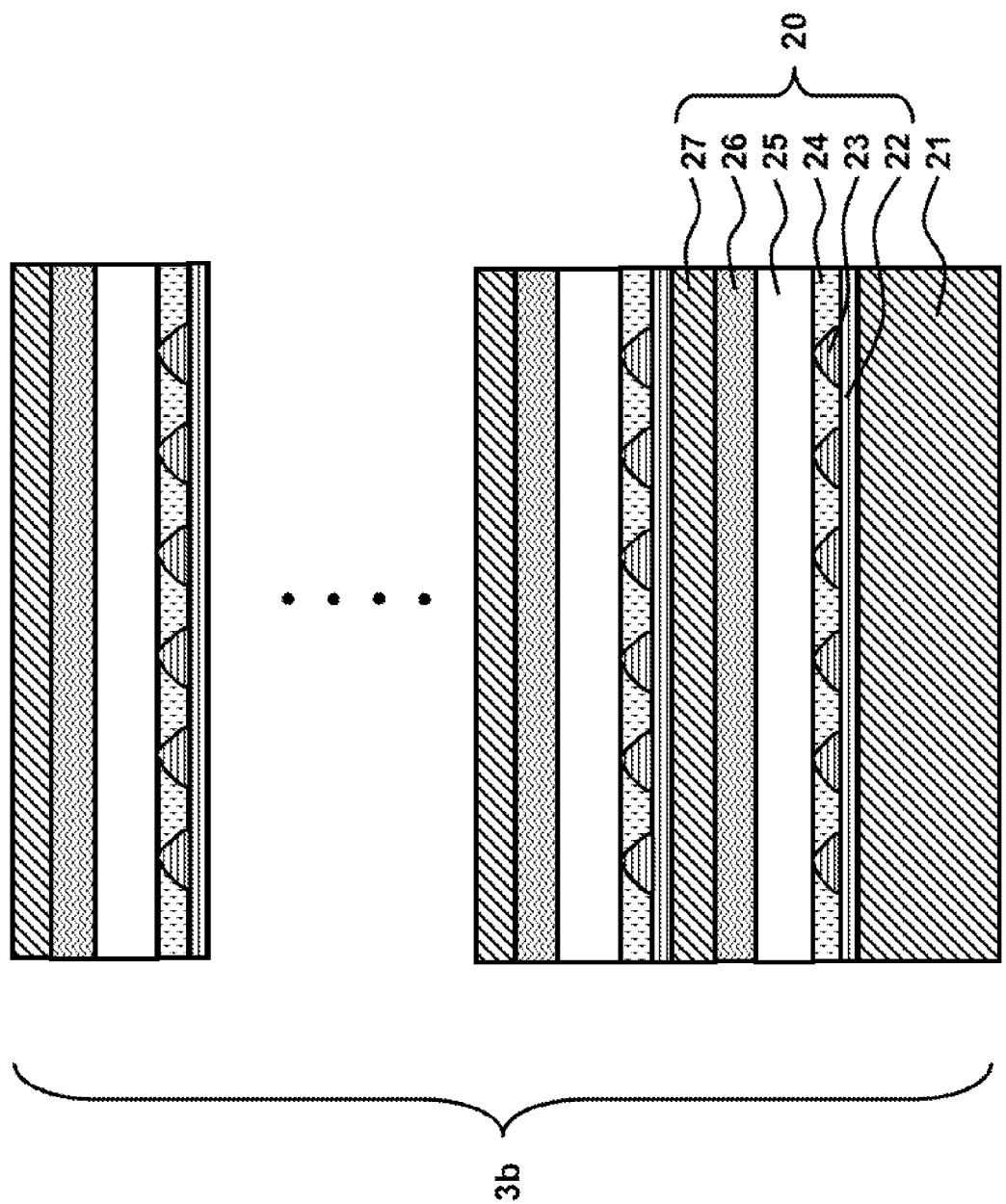
FIG. 9 is a sectional view of an active layer included in the semiconductor diode 50b according to the second embodiment.

FIG. 9 is a sectional view of the active layer 3b. With reference to FIG. 9, reference numeral 20 represents quantum dot layers, reference numeral 21 represents i-GaAs layers, reference numeral 22 represents first i-InAs laminar portions, reference numeral 23 represents second i-InAs laminar portions, reference numeral 24 represents i-InGaAs laminar portions, reference numeral 25 represents first i-GaAs laminar portions, reference numeral 26 represents p-GaAs laminar portions, and reference numeral 27 represents second i-GaAs laminar portions.

The active layer 3b has a structure below.

One of the i-GaAs layers 21 lies on the first cladding layer 2, which is not illustrated. The i-GaAs layers 21 act as barrier layers and preferably have a thickness of, for example, 10 nm to 50 nm. Each first i-InAs laminar portion 22 lies on a corresponding one of the i-GaAs layers 21. The first i-InAs laminar portion 22 preferably has a thickness of, for example, 0.8 nm. The first i-InAs laminar portion 22 acts as a wetting layer, which is necessary to use the so-called Stranski-Krastanow (S-K) growth mode occurring in an initial stage of hetero-epitaxial growth in a strained hetero-epitaxial structure such as an i-InAs/GaAs structure. Since the first i-InAs laminar portion 22 lies on the corresponding i-GaAs layer 21, the second i-InAs laminar portions 23 can be formed on the first i-InAs laminar portion 22 in the form of islands spaced from each other.

The second i-InAs laminar portions 23 act as quantum dot layers and preferably have a height of, for example, 5 nm and a size of, for example, 15 nm to 20 nm. The second i-InAs laminar portions 23 are designed such that the emission wavelength thereof is about 1.3 µm.

Each i-InGaAs laminar portion 24 extends over the second i-InAs laminar portions 23 and a corresponding one of the first i-InAs laminar portions 22 such that the second i-InAs laminar portions 23 are embedded in the i-InGaAs laminar portion 24. The i-InGaAs laminar portion 24 acts as a strain reducing layer and preferably has a thickness of, for example, 5 nm.

Each first i-GaAs laminar portion 25 lies on a corresponding one of the i-InGaAs laminar portions 24. The first i-GaAs laminar portion 25 preferably has a thickness of, for example, 15 nm.

Each p-GaAs laminar portion 26 lies on a corresponding one of the first i-GaAs laminar portions 25. The p-GaAs laminar portion 26 preferably has a thickness of, for example, 10 nm and a p-type impurity concentration of, for example, $5 \times 10^{17}$ $cm^{-3}$.

Each second i-GaAs laminar portion 27 lies on a corresponding one of the p-GaAs laminar portion 26. The second i-GaAs laminar portion 27 preferably has a thickness of, for example, 10 nm. Each quantum dot layer 20 includes a corresponding one of the first i-InAs laminar portions 22, the second i-InAs laminar portions 23, a corresponding one of the i-InGaAs laminar portions 24, a corresponding one of the first i-GaAs laminar portions 25, a corresponding one of the p-GaAs laminar portions 26, and a corresponding one of the second i-GaAs laminar portions 27, which are arranged in that order.

The active layer 3b includes ten of the quantum dot layers 20. In this embodiment, the number of the quantum dot layers 20, but is not limited to, is ten. The number of the quantum dot layers 20 may be varied depending on the intended use of the semiconductor diode 50b. The composition or thickness of the first and second cladding layer 2 and 8 or the composition or thickness of layers included in the active layer 3b is not limited to the above. The active layer 3b is not limited to such a quantum dot layer and may have, for example, a GaInNAs quantum dot structure.

The method of manufacturing the semiconductor diode 50b will now be described in detail with reference to FIGS. 10 to 13.

Figure 10A:
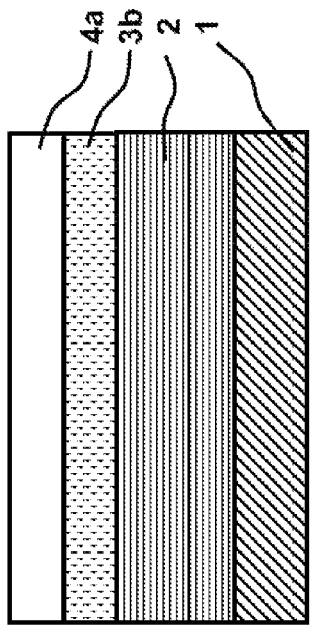
FIGS. 10A-10D are illustrations illustrating operations of a method of manufacturing the semiconductor diode 50b according to the second embodiment.

FIG. 10A is an illustration illustrating that the first cladding layer 2 and the active layer 3b are formed above the p-type GaAs substrate 1 in that order. As illustrated in FIG. 10A, the p-type GaAs buffer layer, which is not illustrated, is deposited on the p-type GaAs substrate 1 in the same manner as that described with reference to FIG. 3A so as to have a thickness of, for example, 400 nm to 500 nm.

The first cladding layer 2 is formed on the p-type GaAs buffer layer in the same manner as that described with reference to FIG. 3A so as to have a thickness of, for example, 1.0 μm to 1.5 μm.

The active layer 3b is formed on the first cladding layer 2 so as to have a thickness of, for example, 300 μm to 500 μm. The active layer 3b has such a quantum dot structure as illustrated in FIG. 9 and is preferably formed by a self-assembly process using MBE or MOVPE.

Figure 10B:
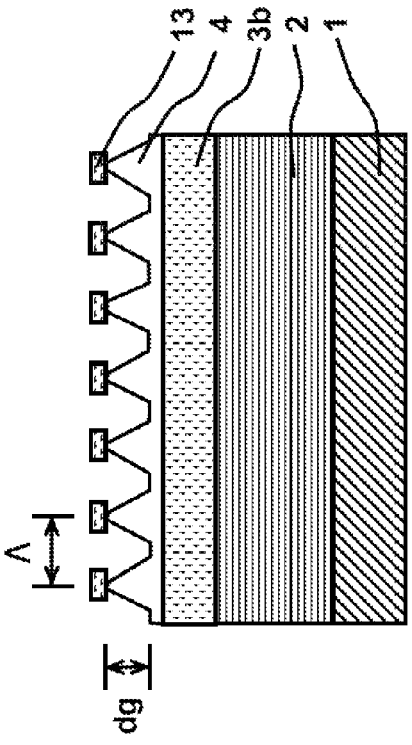

FIG. 10B is an illustration illustrating that a GaAs layer 4a is formed on the active layer 3b. As illustrated in FIG. 10B, the GaAs layer 4a is formed on the active layer 3b so as to have a thickness of, for example, 20 nm to 60 nm. The upper surface of the GaAs layer 4a is preferably parallel to the (100) plane. The GaAs layer 4a is preferably formed by, for example, MBE or MOVPE subsequently to the growth of the active layer 3b. The GaAs layer 4a is preferably undoped.

Figure 10C:
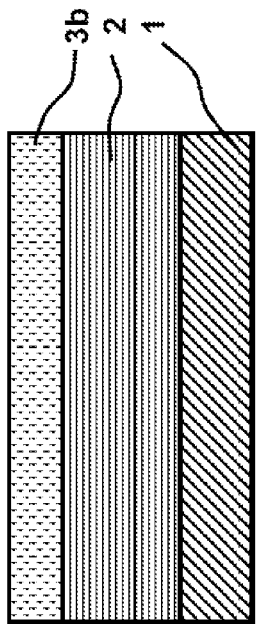

FIG. 10C as well as FIG. 3C is an illustration illustrating that $SiO_2$ mask layers 13 are formed on the GaAs layer 4a.

Figure 10D:
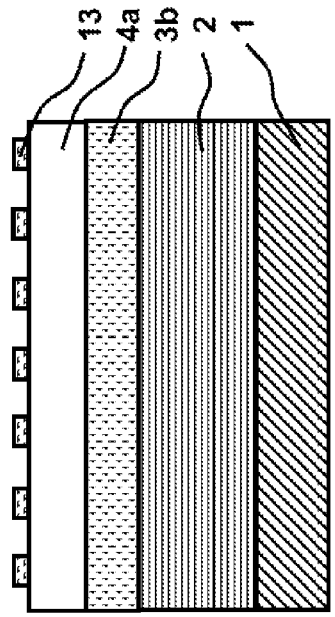

FIG. 10D as well as FIG. 3D is an illustration illustrating that the GaAs layer 4a is etched using the $SiO_2$ mask layers 13 as a mask. The etching of the GaAs layer 4a allows the GaAs layer 4, which has the recessed portions which has a depth dg of 20 nm to 60 nm and which are arranged at a pitch A of 190 nm to 200 nm, to be formed. The GaAs layer 4a anisotropically etched has protruding portions of which the tops have no flat area and which have slopes parallel to the (111) A plane.

Figure 11A:
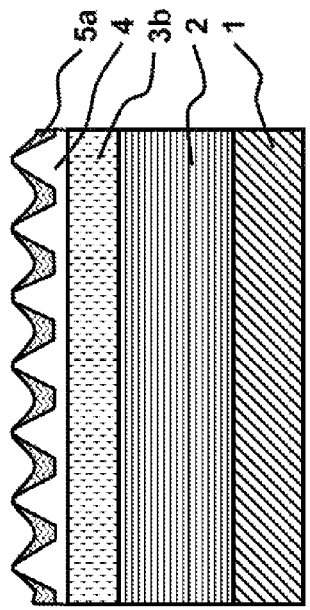
FIGS. 11A-11D are illustrations illustrating operations of the method of manufacturing the semiconductor diode 50b according to the second embodiment.

FIG. 11A as well as FIG. 4A is an illustration illustrating that the $SiO_2$ mask layers 13 are removed from the GaAs layer 4.

Figure 11C:
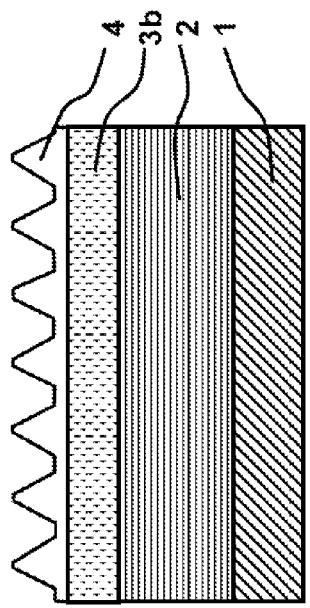
Figure 11B:
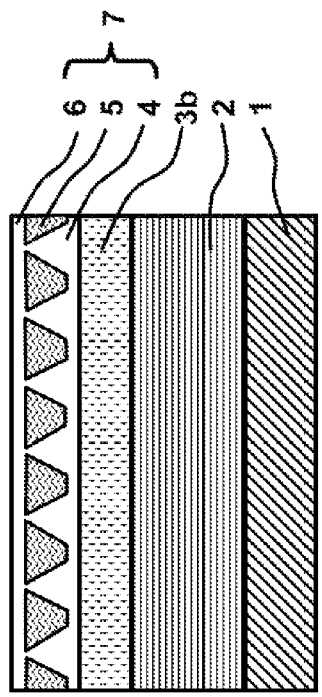

FIG. 11B as well as FIG. 4B is an illustration illustrating that InGaP layers 5a are formed on the GaAs layer 4. Since the tops of the protruding portions have no flat area, the InGaP layers 5a are prevented from being formed on the tops of the protruding portions when the InGaP layers 5a are formed on the GaAs layer 4. Therefore, the InGaP layers 5a are selectively formed in the recessed portions.

FIG. 11C as well as FIG. 4C is an illustration illustrating that the recessed portions are filled with the InGaP layers 5. Since the tops of the protruding portions have no flat area as illustrated in FIG. 11C, the InGaP layers 5 are provided in the recessed portions. Therefore, the tops of the protruding portions and the upper surfaces of the InGaP layers 5 are substantially flush with each other.

Figure 11D:
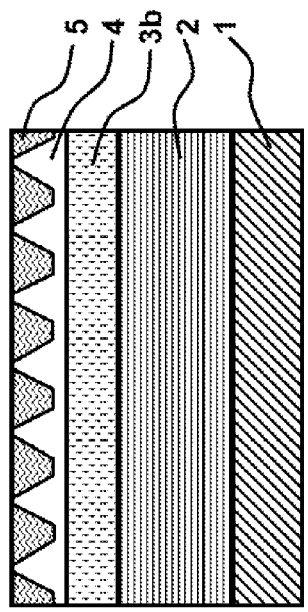

FIG. 11D as well as FIG. 4D is an illustration illustrating that the GaAs cap layer 6 is formed over the tops of the protruding portions and the InGaP layers 5. Since the recessed portions are filled with the InGaP layers 5, the GaAs cap layer 6, which is thin, can be formed so as to have a flat surface. The grating layer 7, in which the recessed portions are filled with the InGaP layers 5, is formed as described above.

Figure 12A:
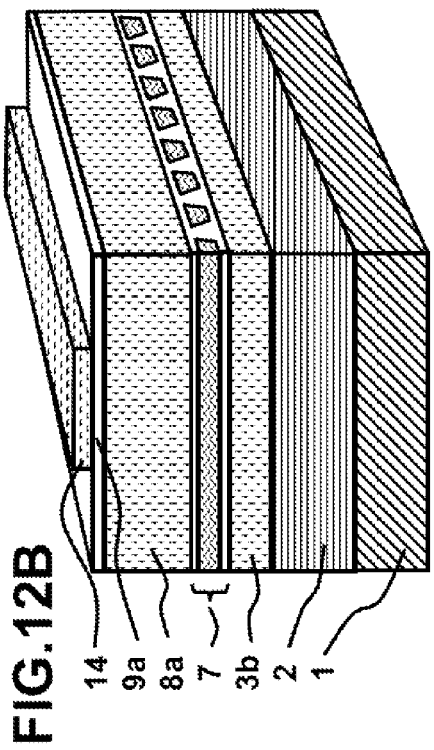
FIGS. 12A-12D are illustrations illustrating operations of the method of manufacturing the semiconductor diode 50b according to the second embodiment.

FIG. 12A as well as FIG. 5A is an illustration illustrating that an n-type InGaP layer 8a and an n-type GaAs layer 9a are deposited on the grating layer 7 in that order. The n-type GaAs layer 9a preferably has a thickness of, for example, 200 nm to 300 nm.

Figure 12B:
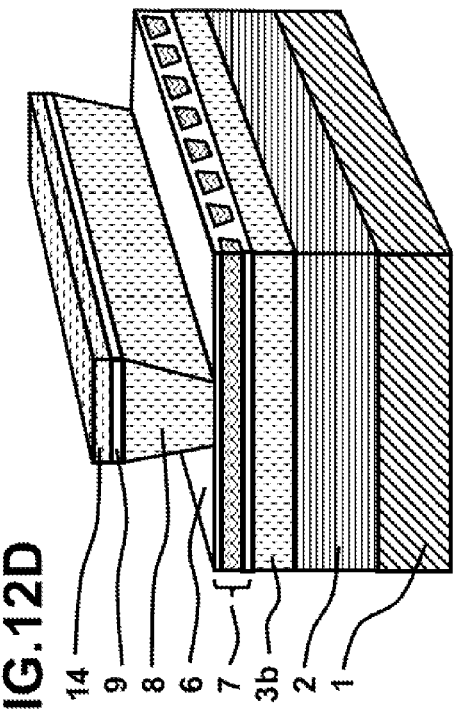

FIG. 12B as well as FIG. 5B is an illustration illustrating that a $SiO_2$ mask layer 14 is formed on the n-type GaAs layer 9a.

Figure 12C:
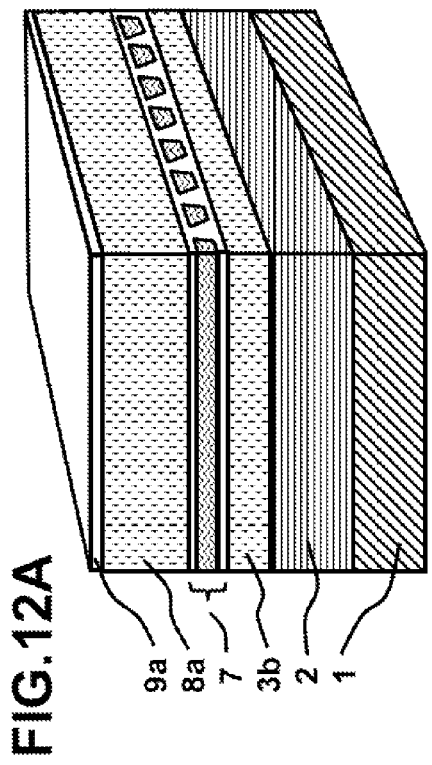

FIG. 12C as well as FIG. 5C is an illustration illustrating that the n-type GaAs layer 9a, which lies on the n-type InGaP layer 8a, is etched using the $SiO_2$ mask layer 14 as a mask.

Figure 12D:
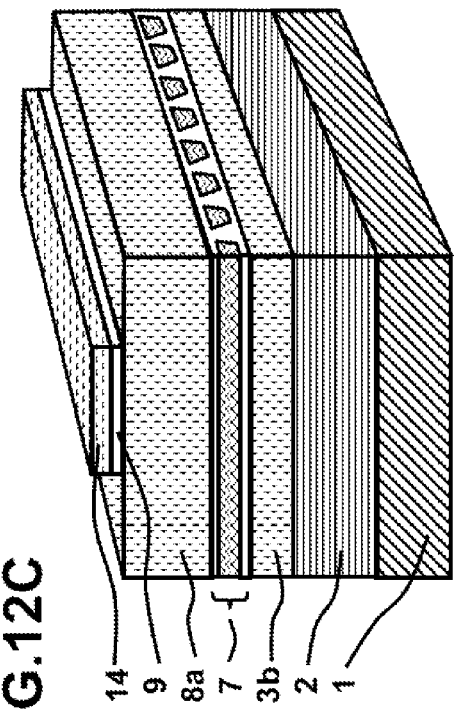

FIG. 12D as well as FIG. 5D is an illustration illustrating that the n-type InGaP layer 8a, which lies on the GaAs cap layer 6, is etched using the $SiO_2$ mask layer 14 as a mask.

FIG. 13A as well as FIG. 6A is an illustration illustrating that the $SiO_2$ mask layer 14 is removed from the contact layer 9.

FIG. 13B as well as FIG. 6B is an illustration illustrating that the $SiO_2$ protective layers 10 are each formed over a side surface of the second cladding layer 8 and the grating layer 7 and the upper electrode 11 is formed over the $SiO_2$ protective layers 10 and the upper electrode 11.

FIG. 13C as well as FIG. 6C is an illustration illustrating that the lower electrode 12 is formed on a surface of the p-type GaAs substrate 1 that is opposite to a surface of the p-type GaAs substrate 1 that is located under the first cladding layer 2.

When the grating layer 7 has a phase shift-free uniform grating structure, an anti-reflective coating and highly reflective coating, which are not illustrated, are formed on the front end surface and rear end surface, respectively, of a laminate including the above layers subsequently to this operation. When the grating layer 7 has a λ/4 phase shift, anti-reflective coatings, which are not illustrated, are formed on the front and rear end surfaces of the laminate. The semiconductor diode 50b is completed through these operations.

According to the manufacturing method and structure of the semiconductor diode 50b of the second embodiment, the active layer 3b includes the quantum dot layers 20. Therefore, the semiconductor diode 50b of the second embodiment has lower power consumption and less temperature dependence as compared to the semiconductor diode 50a of the first embodiment.

A semiconductor diode 50c according to a third embodiment and a method of manufacturing the semiconductor diode 50c will now be described in detail with reference to FIGS. 14 to 19. In this embodiment, the same components as those described in the first or second embodiment are represented by the same reference numerals as those used in the first or second embodiment and will not be described in detail.

According to the method of manufacturing the semiconductor diode 50c of the third embodiment, the number of quantum dot layers included in an active layer 3c is four and is less than that of those included in the active layer 3b of the semiconductor diode 50b of the second embodiment. An upper portion of a first cladding layer contains $Al_{0.45}Ga_{0.55}As$ with low refractive index and an upper portion of a second cladding layer contains $Al_{0.35}Ga_{0.65}As$ with a refractive index greater than that of InGaP.

In the semiconductor diode 50b of the second embodiment, the second cladding layer 8 contains InGaP, which has low refractive index; hence, the field of light is unlikely to leaking to the ridge structure and the effect of vertically confining light is large but the effect of horizontally confining light is small. This results in the formation of an elliptical far-field pattern (FFP) which is vertically large and horizontally small.

In the semiconductor diode 50c of the third embodiment, the field of light is attracted into a ridge structure in contrast to that of the second embodiment. This reduces the effect of vertically confining light but increases the effect of horizontally confining light as compared to the second embodiment. Therefore, the FFP of the semiconductor diode 50c can be rendered substantially circular in the vertical direction and in the horizontal direction. When the FFP thereof is substantially circular, the effect of coupling the semiconductor diode 50c to a lens can be improved upon the assembly of the semiconductor diode 50c into an optical module.

Figure 14:
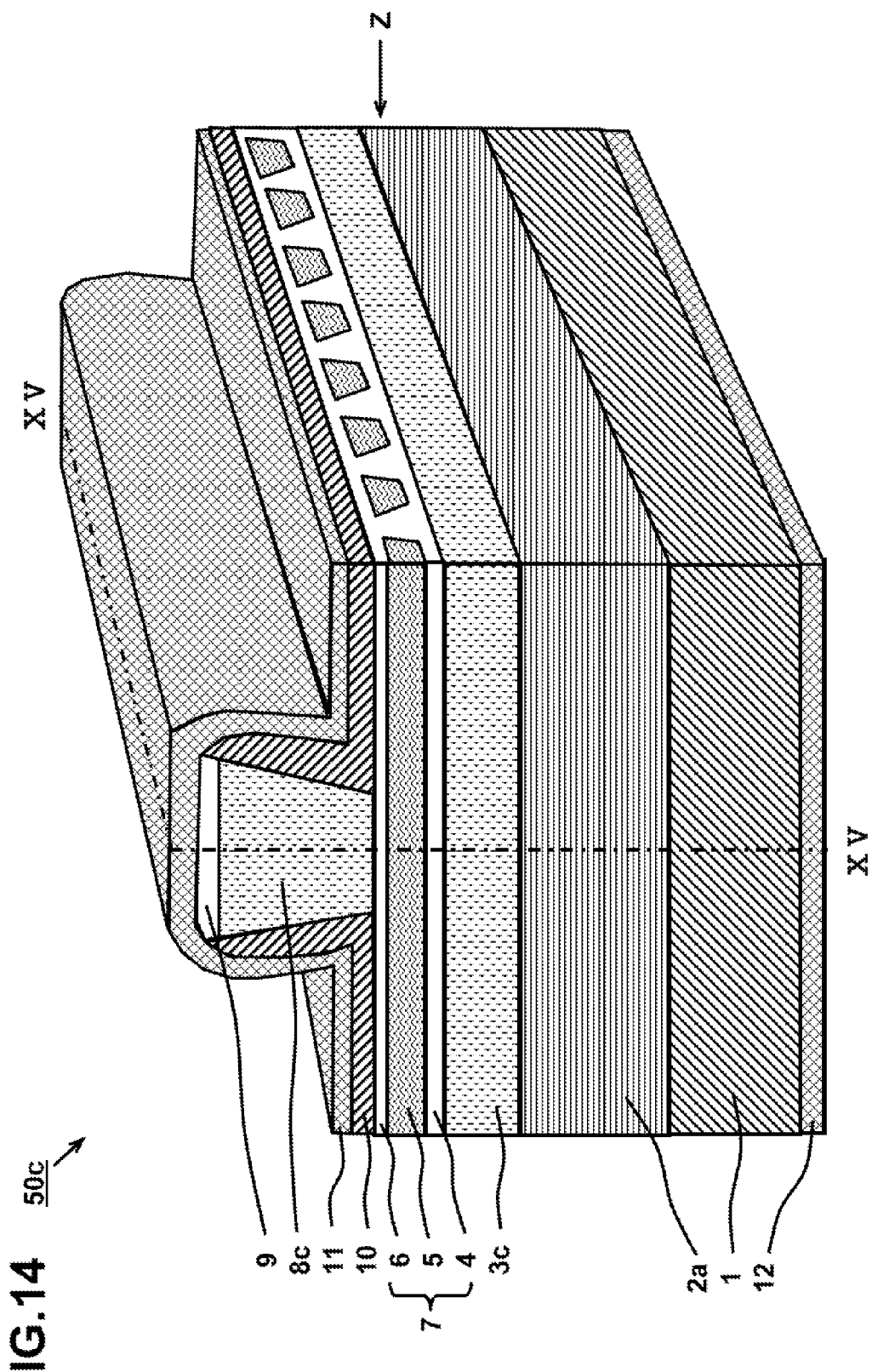
FIG. 14 is a perspective view of a semiconductor diode 50c according to a third embodiment.
Figure 15:
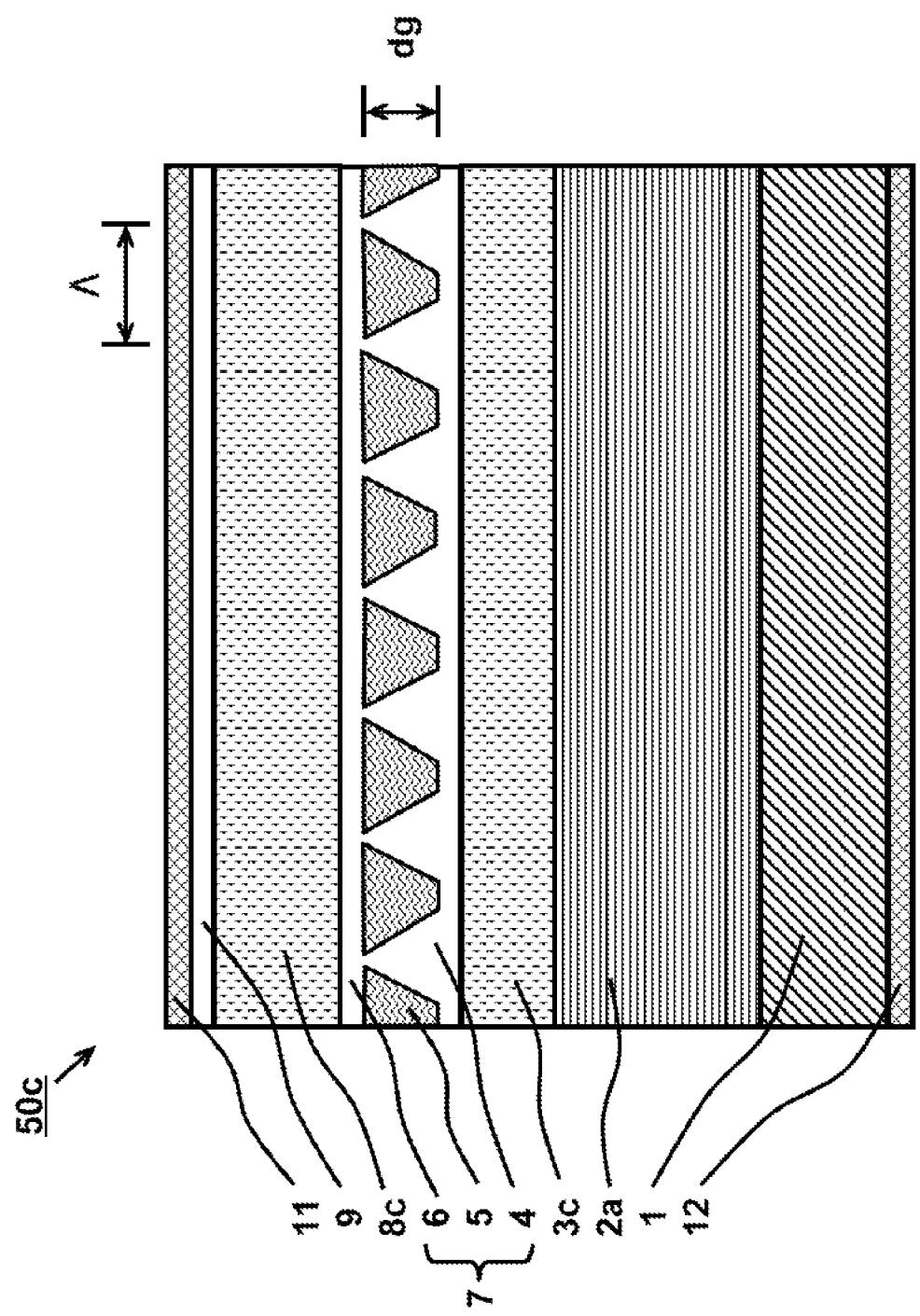
FIG. 15 is a sectional view of the semiconductor diode 50c according to the third embodiment.

FIG. 14 is a perspective view of the semiconductor diode 50c. FIG. 15 is a sectional view of the semiconductor diode 50c taken along the line XV-XV of FIG. 14, the semiconductor diode 50c being viewed in the z-direction.

With reference to FIG. 14, reference numeral 1 represents a p-type GaAs substrate, reference numeral 2a represents a first cladding layer, reference numeral 3c represents the active layer, reference numeral 4 represents a GaAs layer, reference numeral 5 represents InGaP layers, reference numeral 6 represents a GaAs cap layer, reference numeral 7 represents a grating layer, reference numeral 8c represents a second cladding layer, reference numeral 9 represents a contact layer, reference numeral 10 represents $SiO_2$ protective layers, reference numeral 11 represents an upper electrode, and reference numeral 12 represents a lower electrode.

The first cladding layer 2a overlies the p-type GaAs substrate 1 as illustrated in FIG. 14. The p-type GaAs substrate 1 has a thickness of, for example, 100 μm to 300 μm. A p-type GaAs buffer layer, which is not illustrated, lies on the p-type GaAs substrate 1. The p-type GaAs buffer layer has a thickness of, for example, 500 nm.

The first cladding layer 2a includes, for example, a p-type $Al_{0.35}Ga_{0.65}As$ layer and a p-type $Al_{0.45}Ga_{0.55}As$ layer lying thereon. The p-type $Al_{0.35}Ga_{0.65}As$ layer preferably has a thickness of, for example, 1.0 μm to 1.5 μm. The p-type $Al_{0.45}Ga_{0.55}As$ layer preferably has a thickness of, for example, 100 nm to 300 nm.

The active layer 3c lies on the first cladding layer 2a. The active layer 3c has a quantum dot structure and includes four quantum dot layers, which are the same as the quantum dot layers 20 illustrated in FIG. 9.

The grating layer 7 extends over the entire length of the active layer 3c in parallel to the active layer 3c. The grating layer 7 has a region including portions of the GaAs layer 4 and the InGaP layers 5. The GaAs layer portions are different in refractive index from the InGaP layers 5. The GaAs layer portions and the InGaP layers 5 are periodically arranged along the active layer 3c. The pitch of the GaAs layer portions is the same as that of the InGaP layers 5. The grating layer 7 includes the GaAs layer 4, the InGaP layers 5, and the GaAs cap layer 6. The structure of the grating layer 7 is described below in detail with reference to FIG. 15.

The second cladding layer 8c overlies the grating layer 7. The second cladding layer 8c preferably includes an n-type InGaP layer and an n-type $Al_{0.35}Ga_{0.65}As$ layer. The type InGaP layer preferably has a thickness of, for example, 5 nm to 50 nm. The n-type $Al_{0.35}Ga_{0.65}As$ layer preferably has a thickness of, for example, 1.0 μm to 1.5 μm.

The structure of the grating layer 7 is described below with reference to FIG. 15.

With reference to FIG. 15, the grating layer 7 as well as that illustrated in FIG. 8 includes the GaAs layer 4, the InGaP layers 5, and the GaAs cap layer 6 as described above. The GaAs layer 4 includes an undoped GaAs laminar portion and an n-type GaAs laminar portion deposited thereon. The undoped GaAs laminar portion preferably has a thickness of, for example, 10 nm to 30 nm. The n-type GaAs laminar portion preferably has a thickness of, for example, 10 nm to 30 nm.

The GaAs layer 4 has recessed portions which are arranged at a pitch A of, for example, 190 nm to 200 nm and which have two slopes parallel to the (111) A plane. The depth dg of the recessed portions is preferably, for example, 20 nm. The pitch of the recessed portions of the GaAs layer 4 is set such that the emission wavelength of the semiconductor diode 50b is about 1.3 μm. The depth of the recessed portions is set such that the coupling coefficient κ of the grating layer 7 is about 50 $cm^{-1}$ to 100 $cm^{-1}$.

The InGaP layers 5 as well as those illustrated in FIG. 8 are disposed in the recessed portions. The InGaP layers 5 preferably have a thickness of, for example, less than 50 nm and may be arranged over the upper surface of the GaAs layer 4.

The GaAs cap layer 6 as well as that illustrated in FIG. 8 extends over the GaAs layer 4 and the InGaP layers 5. The GaAs cap layer 6 preferably has a thickness of, for example, 5 nm to 20 nm.

The method of manufacturing the semiconductor diode 50c will now be described in detail with reference to FIGS. 16 to 19.

Figure 16A:
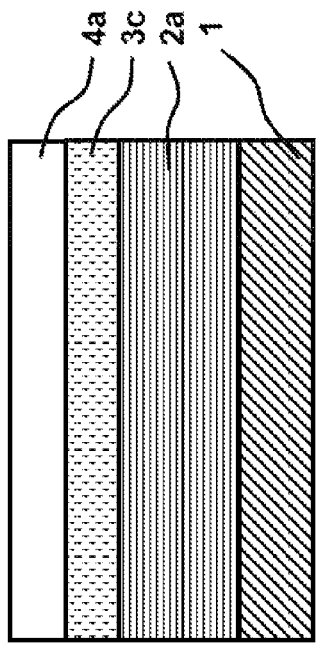
FIGS. 16A-16D are illustrations illustrating operations of a method of manufacturing the semiconductor diode 50c according to the third embodiment.

FIG. 16A is an illustration illustrating that the first cladding layer 2a and the active layer 3c are formed above the p-type GaAs substrate 1 in that order. As illustrated in FIG. 16A, the p-type GaAs buffer layer, which is not illustrated, is deposited on the p-type GaAs substrate 1 in the same manner as that described with reference to FIG. 3A so as to have a thickness of, for example, 400 nm to 500 nm.

The first cladding layer 2a is formed on the p-type GaAs buffer layer of the p-type GaAs substrate 1 in the same manner as that described with reference to FIG. 10A so as to have a thickness of, for example, 1.0 μm to 1.5 μm. In particular, the first cladding layer 2a is formed in such a manner that the p-type $Al_{0.35}Ga_{0.65}As$ layer and the p-type $Al_{0.45}Ga_{0.55}As$ layer are deposited on the p-type GaAs buffer layer in that order.

The active layer 3c is formed on the first cladding layer 2a so as to have a thickness of, for example, 120 nm to 200 nm. The active layer 3c has such a quantum dot structure as illustrated in FIG. 9 and is preferably formed by a self-assembly process using MBE or MOVPE.

Figure 16B:
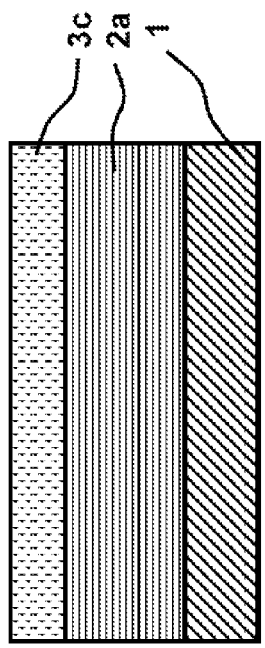

FIG. 16B is an illustration illustrating that a GaAs layer 4a is formed on the active layer 3c. As illustrated in FIG. 16B, the GaAs layer 4a is formed on the active layer 3c so as to have a thickness of, for example, 20 nm to 60 nm.

The GaAs layer 4a is formed in such a manner that the undoped GaAs laminar portion and the n-type GaAs laminar portion are deposited on the active layer 3c in that order.

The upper surface of the GaAs layer 4a is preferably parallel to the (100) plane. The GaAs layer 4a is preferably formed by, for example, MOVPE.

Figure 16C:
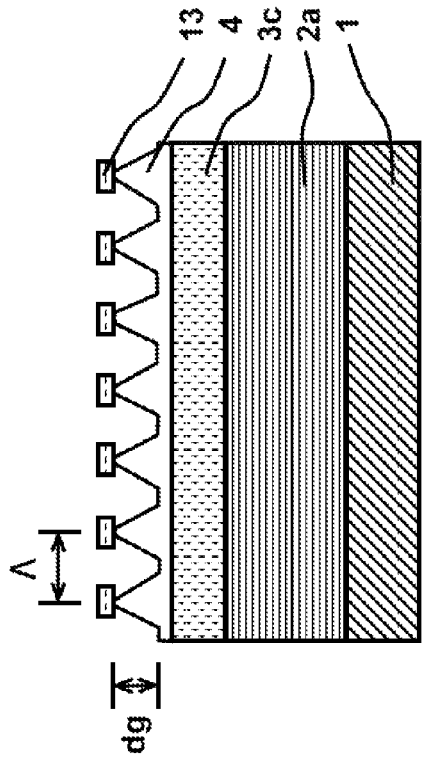

FIG. 16C as well as FIG. 10C is an illustration illustrating that $SiO_2$ mask layers 13 are formed on the GaAs layer 4a.

Figure 16D:
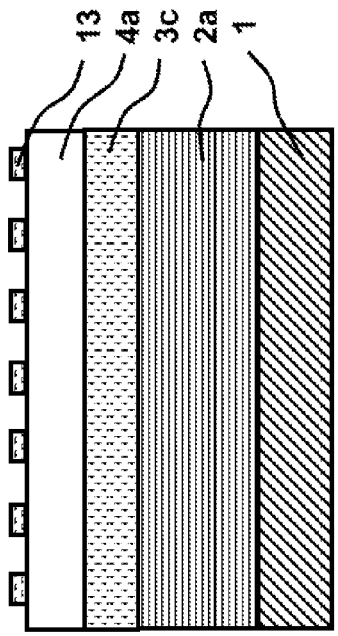

FIG. 16D as well as FIG. 10D is an illustration illustrating that the GaAs layer 4a is etched using the $SiO_2$ mask layers 13 as a mask. The etching of the GaAs layer 4a allows the GaAs layer 4, which has the recessed portions which has a depth dg of 20 nm and which are arranged at a pitch A of 200 nm, to be formed. The etched GaAs layer 4 has protruding portions of which the tops have no flat area and which have slopes parallel to the (111) A plane.

Figure 17A:
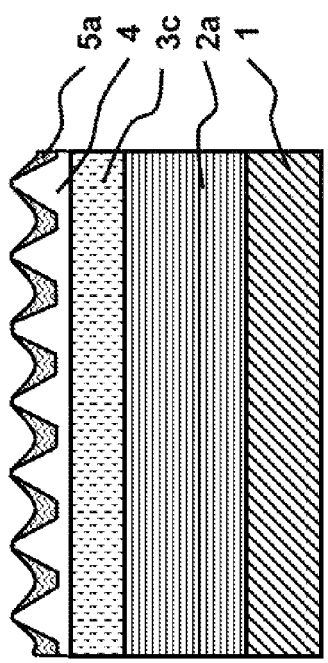
FIGS. 17A-17D are illustrations illustrating operations of the method of manufacturing the semiconductor diode 50c according to the third embodiment.

FIG. 17A as well as FIG. 11A is an illustration illustrating that the $SiO_2$ mask layers 13 are removed from the GaAs layer 4.

Figure 17C:
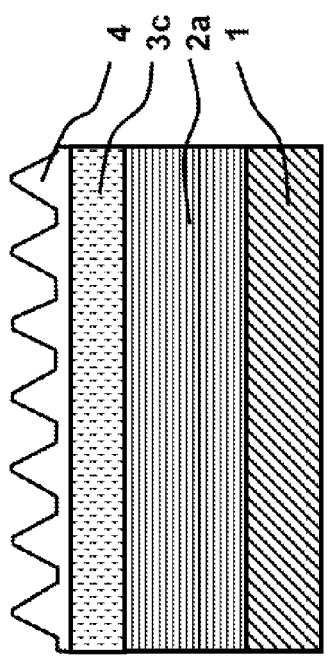
Figures 17B, 17D:
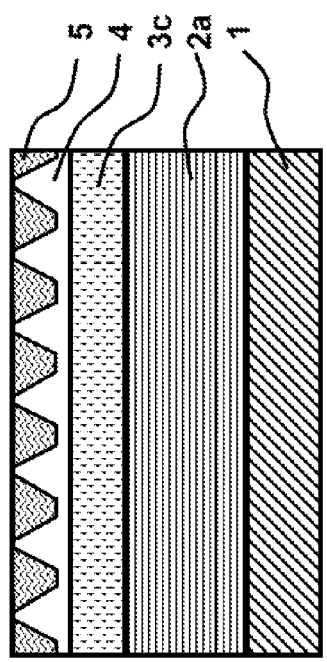

FIG. 17B as well as FIG. 11B is an illustration illustrating that InGaP layers 5a are formed on the GaAs layer 4. The InGaP layers 5 are preferably undoped. Since the distance between the upper ends of the adjacent recessed portions are less in width than the bottoms of the recessed portions, and the width of the bottom surface being greater than the minimal gaps, the InGaP layers 5a are prevented from being formed on the tops of the protruding portions when the InGaP layers 5a are formed on the GaAs layer 4. Therefore, the InGaP layers 5a are selectively formed in the recessed portions.

FIG. 17C as well as FIG. 11C is an illustration illustrating that the recessed portions are filled with the InGaP layers 5. Since the tops of the protruding portions have no flat area as illustrated in FIG. 17C, the InGaP layers 5 are placed into the recessed portions. Therefore, the tops of the protruding portions and the upper surfaces of the InGaP layers 5 are substantially flush with each other.

FIG. 17D as well as FIG. 11D is an illustration illustrating that the GaAs cap layer 6 is formed over the tops of the protruding portions and the InGaP layers 5. Since the recessed portions are filled with the InGaP layers 5, the GaAs cap layer 6, which is thin, can be formed so as to have a flat surface. The grating layer 7, in which the recessed portions are filled with the InGaP layers 5, is formed as described above.

FIG. 18A is an illustration illustrating that the n-type InGaP layer, the n-type $Al_{0.35}Ga_{0.65}As$ layer 8b, and an n-type GaAs layer 9a are deposited on the grating layer 7 in that order. The n-type InGaP layer and the n-type $Al_{0.35}Ga_{0.65}As$ layer 8b are formed on the grating layer 7 by, for example, MOVPE in that order. The n-type InGaP layer preferably has a thickness of, for example, 5 nm to 50 nm. The n-type $Al_{0.35}Ga_{0.65}As$ layer preferably has a thickness of, for example, 1.0 μm to 1.5 μm. The n-type GaAs layer 9a is then formed on the n-type $Al_{0.35}Ga_{0.65}As$ layer 8b by, for example, MOVPE. The n-type GaAs layer 9a preferably has a thickness of, for example, 200 nm to 300 nm.

FIG. 18B as well as FIG. 12B is an illustration illustrating that a $SiO_2$ mask layer 14 is formed on the n-type GaAs layer 9a.

FIG. 18C as well as FIG. 12C is an illustration illustrating that the n-type GaAs layer 9a, which overlies the n-type InGaP layer and the n-type $Al_{0.35}Ga_{0.65}As$ layer 8b, is etched using the $SiO_2$ mask layer 14 as a mask.

FIG. 18D is an illustration illustrating that the n-type InGaP layer and the n-type $Al_{0.35}Ga_{0.65}As$ layer 8b, which overlie the GaAs cap layer 6, is etched using the $SiO_2$ mask layer 14 as a mask.

As illustrated in FIG. 18D, the n-type $Al_{0.35}Ga_{0.65}As$ layer 8b is etched with a solution prepared by mixing, for example, aqueous ammonia ($NH_3$), aqueous hydrogen peroxide ($H_2O_2$), and water ($H_2O$). The mixing ratio of aqueous ammonia to aqueous hydrogen peroxide to water is preferably, for example, three to one to 50. The n-type InGaP layer, which lies on the GaAs cap layer 6, is isotropically etched with a solution prepared by mixing, for example, hydrochloric acid (HCl) and acetic acid ($CH_3COOH$). The ratio of hydrochloric acid to acetic acid in this solution is preferably, for example, one to two. In this etching operation, the second cladding layer 8 is formed. The second cladding layer 8 has a ridge structure, lies on the GaAs cap layer 6, extends over the entire length of the active layer 3c, and has a width of, for example, 1.5 μm to 2.0 μm.

The GaAs cap layer 6 acts as an etching stopper for the n-type InGaP layer. This is because the GaAs cap layer 6 may not be etched hydrochloric acid (HCl) or acetic acid ($CH_3COOH$). Therefore, the ridge structure of the second cladding layer 8 can be formed with high accuracy.

FIG. 19A as well as FIG. 13A is an illustration illustrating that the $SiO_2$ mask layer 14 is removed from the contact layer 9.

FIG. 19B as well as FIG. 13B is an illustration illustrating that the $SiO_2$ protective layers 10 are each formed over a side surface of the second cladding layer 8c and the grating layer 7 and the upper electrode 11 is formed over the $SiO_2$ protective layers 10 and the upper electrode 11.

FIG. 19C as well as FIG. 13C is an illustration illustrating that the lower electrode 12 is formed on a surface of the p-type GaAs substrate 1 that is opposite to a surface of the p-type GaAs substrate 1 that is located under the first cladding layer 2.

When the grating layer 7 has a phase shift-free uniform grating structure, an anti-reflective coating and highly reflective coating, which are not illustrated, are formed on the front end surface and rear end surface, respectively, of a laminate including the above layers subsequently to the above operation. When the grating layer 7 has a λ/4 phase shift, anti-reflective coatings, which are not illustrated, are formed on the front and rear end surfaces of the laminate. The semiconductor diode 50c is completed through these operations.

According to the method of manufacturing the semiconductor diode 50c of the third embodiment, the number of the quantum dot layers included in the active layer 3c is four and is less than that of those included in the active layer 3b of the semiconductor diode 50b of the second embodiment. An upper portion of the first cladding layer contains $Al_{0.45}Ga_{0.55}As$ with low refractive index and an upper portion of the second cladding layer contains $Al_{0.35}Ga_{0.65}As$ with a refractive index greater than that of InGaP.

In the semiconductor diode 50b of the second embodiment, the second cladding layer 8 contains InGaP, which has low refractive index; hence, the field of light is unlikely to leaking to the ridge structure and the effect of vertically confining light is large but the effect of horizontally confining light is small. This results in the formation of an elliptical far-field pattern which is vertically large and horizontally small.

In the semiconductor diode 50c of the third embodiment, the field of light is attracted into the ridge structure in contrast to that of the second embodiment. This reduces the effect of vertically confining light but increases the effect of horizontally confining light as compared to the second embodiment. Therefore, the FFP of the semiconductor diode 50c can be rendered substantially circular in the vertical direction and in the horizontal direction. When the FFP thereof is substantially circular, the effect of coupling the semiconductor diode 50c to a lens can be improved upon the assembly of the semiconductor diode 50c into an optical module.

In this embodiment, the p-type GaAs substrate 1 is used. However, an n-type GaAs substrate may be used instead. In this case, a p-type grating layer, a p-type second cladding layer, and a p-type contact layer can be used.

In this embodiment, the ridge structure is formed by placing the grating layer 7 on the active layer 3c. However, the grating layer 7 may be placed under the active layer 3c. In this case, the GaAs cap layer 6, which is in contact with the grating layer 7, can be formed so as to have a reduced thickness. This reduces the distance between the active layer 3c and the grating layer 7 and therefore allows the grating layer 7 to have a large coupling coefficient κ.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A semiconductor laser comprising:
an active layer;
a first GaAs layer formed on the active layer, the first GaAs layer including a plurality of recessed portions periodically arranged, each of the recessed portions including a bottom surface of a (100) crystal surface and a slope including a (111) A crystal surface at least in parts, the recessed portion being disposed in contact with each other or with a minimal gap between each of adjacent ones of the recessed portions, the width of the bottom surface being greater than the minimal gaps;
an InGaP layer formed on the recessed portion; and
a second GaAs layer formed on the InGaP layer over the recessed portion.

2. The semiconductor laser according to claim 1, further comprising:
a first cladding layer formed on a substrate including a GaAs layer including a (100) crystal surface, the substrate including a first conductivity type, the first cladding layer including the first conductivity type; and
a second cladding layer formed on the second GaAs layer, the second cladding layer including a second conductivity type.

3. The semiconductor laser according to claim 2, wherein the first cladding layer includes p-type AlGaAs and the second cladding layer includes n-type InGaP.

4. The semiconductor laser according to claim 2, wherein the first cladding layer is formed by sequentially forming a p-type $Al_{0.35}Ga_{0.65}As$ layer and a p-type $Al_{0.45}Ga_{0.55}As$ layer, and the second cladding layer is formed by sequentially forming an n-type InGaP layer and an n-$Al_{0.35}Ga_{0.65}As$ layer.

5. The semiconductor laser according to claim 1, wherein the active layer includes a quantum dot layer.

6. The semiconductor laser according to claim 1, wherein the active layer includes such as GaAs, GaInNAs, InAs, or InGaAs.

7. A method of manufacturing a semiconductor laser, comprising:
forming an active layer;
forming a first GaAs layer on the active layer, the first GaAs layer including a (100) crystal surface;
forming a mask on the first GaAs layer, the mask being periodically arranged on the first GaAs layer;
etching a surface of the (100) crystal surface of the first GaAs layer by using an etching solution to form a recessed portion including a slope of a (111) A crystal surface at least in parts;
forming an InGaP layer on the recessed portions; and
forming a second GaAs layer on the InGaP layer over the first GaAs layer.

8. The method according to claim 7, further comprising:
forming a first cladding layer on a substrate including a GaAs layer including a (100) crystal surface, the substrate having a first conductivity type, the first cladding layer including a first conductivity type;
forming a second cladding layer on the second GaAs layer, the second cladding layer including a second conductivity type; and
etching the second GaAs layer to form a ridge structure of the second GaAs layer by using the second cladding layer as an etching stopper;
wherein the active layer is formed on the first cladding layer.

9. The method according to claim 7, wherein the etching the surface of the (100) crystal surface of the first GaAs layer by using the etching solution to form the recessed portion including the slope of the (111) A crystal surface at least in parts is performed by using the etching solution including aqueous ammonium, aqueous hydrogen peroxide, and water.

10. The method according to claim 9, wherein the etching the surface of the (100) crystal surface of the first GaAs layer by using the etching solution to form the recessed portion including the slope of the (111) A crystal surface at least in parts is performed by using the etching solution including aqueous ammonium, aqueous hydrogen peroxide, and water at a ratio of three to one to 50.

11. The method according to claim 8, wherein the first cladding layer is formed to include a p-type AlGaAs and the second cladding layer is formed to include an n-type InGaP.

12. The method according to claim 8, wherein the first cladding layer is formed by sequentially forming a p-type $Al_{0.35}Ga_{0.65}As$ layer and a p-type $Al_{0.45}Ga_{0.55}As$ layer, and the second cladding layer is formed by sequentially forming an n-type InGaP layer and an n-$Al_{0.35}Ga_{0.65}As$ layer.

13. The method according to claim 7, wherein the active layer is formed to include a quantum dot layer.

14. The method according to claim 7, wherein the active layer is formed to include a semiconductor material such as GaAs, GaInNAs, InAs, or InGaAs.

* * * * *